(12) United States Patent
Takeuchi

(10) Patent No.: US 8,526,557 B2
(45) Date of Patent: Sep. 3, 2013

(54) SIGNAL TRANSMISSION SYSTEM, SIGNAL PROCESSING DEVICE, REFERENCE SIGNAL TRANSMITTING DEVICE, REFERENCE SIGNAL RECEIVING DEVICE, ELECTRONIC DEVICE, AND SIGNAL TRANSMISSION METHOD

(75) Inventor: Hidenori Takeuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 210 days.

(21) Appl. No.: 13/067,321

(22) Filed: May 25, 2011

(65) Prior Publication Data
US 2011/0299621 A1  Dec. 8, 2011

(30) Foreign Application Priority Data
Jun. 7, 2010  (JP) ................................. 2010-130275

(51) Int. Cl.
*H04L 7/00* (2006.01)
(52) U.S. Cl.
USPC ........... 375/356; 375/362; 375/219; 375/220; 375/222; 348/536; 348/537; 327/158; 327/144; 327/147
(58) Field of Classification Search
USPC ................. 375/356, 362, 373, 375, 376, 295, 375/316, 219, 222, 220; 361/764; 348/536, 348/537; 327/158, 144, 147
See application file for complete search history.

(56) References Cited

U.S. PATENT DOCUMENTS
8,059,200 B2 * 11/2011 Chen .............................. 348/536
8,102,665 B2 * 1/2012 Rofougaran ................... 361/764

FOREIGN PATENT DOCUMENTS
JP    2003-244016    8/2003

* cited by examiner

*Primary Examiner* — Phuong Phu
(74) *Attorney, Agent, or Firm* — Rader, Fishman & Grauer PLLC

(57) ABSTRACT

Disclosed herein is a signal transmission system including: a first signal processing section configured to perform signal processing on a basis of a reference signal; a high-frequency reference signal generating section configured to generate and transmit a high-frequency reference signal having a higher frequency than the reference signal such that the high-frequency reference signal is synchronized with the reference signal; a low-frequency reference signal generating section configured to receive the high-frequency reference signal from the high-frequency reference signal generating section, and generate a low-frequency reference signal having a lower frequency than the high-frequency reference signal such that the low-frequency reference signal is synchronized with the received high-frequency reference signal; and a second signal processing section configured to perform signal processing on a basis of the low-frequency reference signal generated by the low-frequency reference signal generating section.

9 Claims, 21 Drawing Sheets

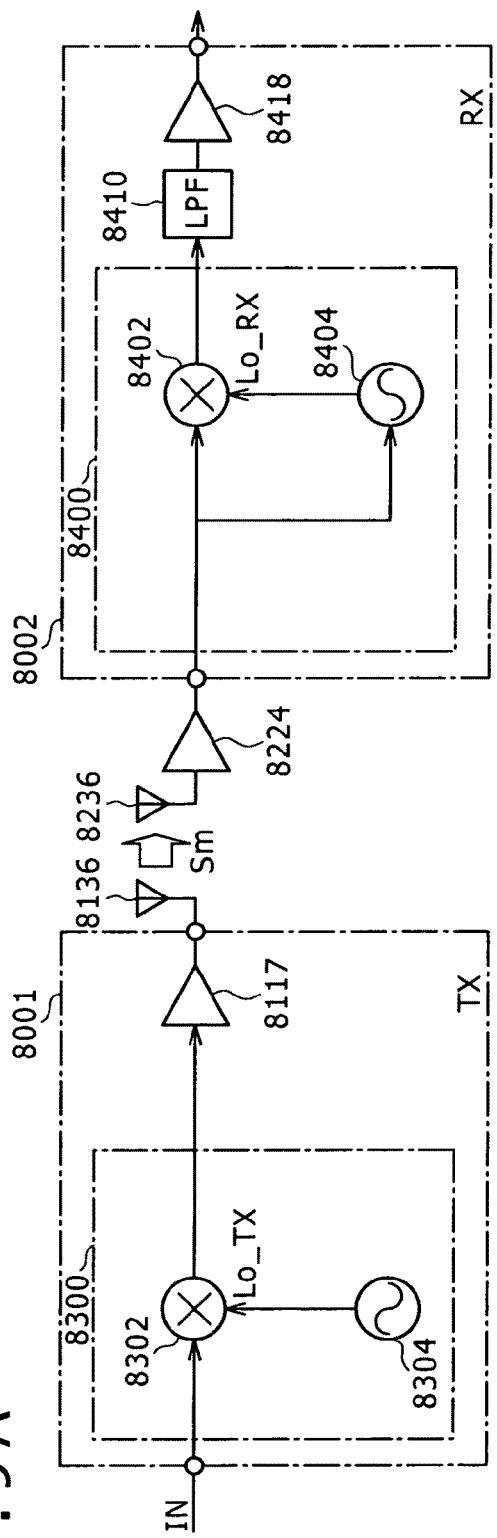
FIG. 9A
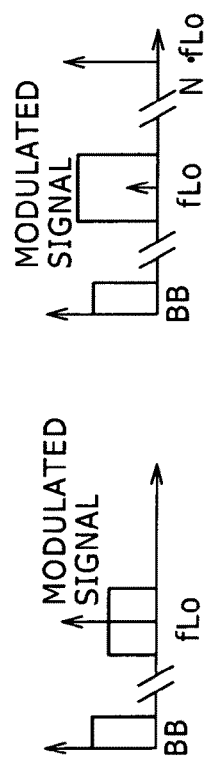
FIG. 9B
FIG. 9C
BB: BASEBAND SIGNAL
fLo: FREQUENCY OF CARRIER SIGNAL
N·fLo: FREQUENCY EQUAL TO INTEGRAL MULTIPLE OF fLo

SIGNAL TRANSMISSION SYSTEM, SIGNAL PROCESSING DEVICE, REFERENCE SIGNAL TRANSMITTING DEVICE, REFERENCE SIGNAL RECEIVING DEVICE, ELECTRONIC DEVICE, AND SIGNAL TRANSMISSION METHOD

BACKGROUND

The present disclosure relates to a signal transmission system, a signal processing device, an electronic device, reference signal transmitting device, reference signal receiving device, and a signal transmission method. More particularly, the present disclosure relates to a mechanism of performing signal processing using a reference signal (reference clock). For example, the present disclosure relates to handling of a local oscillation signal when communication is performed between a plurality of radio communicating devices.

There is a case of performing signal processing using a reference signal (reference clock) in an electronic device. In this case, when a plurality of circuit functional parts need the reference signal, there is a problem of how to provide the reference signal to each position (supply the reference signal to each circuit functional part).

For example, when a plurality of chips (semiconductor integrated circuits) that need a reference signal generated by a crystal oscillator or the like as a clock for a digital circuit or a reference for a synthesizer are necessary within an electronic device, providing each chip with an oscillator is considered. In this case, however, interference between a plurality of oscillation signals occurs, and thus a measure against noise is necessary.

When a reference signal is shared, and the reference signal is transmitted to each position, interference is eliminated, and thus the need for a measure against noise is obviated. In this case, however, wiring for sharing the reference signal and transmitting the reference signal to each position becomes necessary, there is a fear of an increase in effect of signal distortion due to reflection and the like, and a problem of spurious radiation also occurs when the level of the reference signal is increased. For example, LVDS (Low Voltage Differential Signaling) is known as a method for realizing high-speed signal transmission between electronic devices arranged at a relatively short distance (within a few centimeters to a few ten centimeters, for example) from each other or within an electronic device, and transmitting the reference signal by applying LVDS is considered. However, when the frequency of the reference signal is increased, LVDS is reaching a limit because of the problems of signal distortion, spurious radiation and the like.

In addition, when communication using synchronous detection is performed in a field of communication, the respective local oscillation frequencies of a transmitting device and a receiving device (also referred to collectively as a transmitter-receiver) have to be synchronized with each other. For this synchronization, the local oscillation signals may be generated on the basis of a common reference signal. In this case, although the local oscillation frequencies are synchronized with each other, wiring for sharing the reference signal and transmitting the reference signal to the transmitting device and the receiving device becomes necessary, and a problem of radiation also occurs when the level of the reference signal is increased, as described above. As another method, synchronization may be achieved by a received baseband signal while local oscillation signals not synchronized with each other are used. However, the method increases a circuit scale and power consumption.

In addition, Japanese Patent Laid-Open No. 2003-244016 (referred to as Patent Document 1 hereinafter) proposes a system in which a local oscillation signal in a millimeter wave band is transmitted, and in which transmission and reception are performed after an intermediate frequency band signal is raised to the millimeter wave band using the common local oscillation signal received by each communication chip. However, this mechanism is a system limited to communication using intermediate frequency band signals, and a signal processing circuit for generating and processing the intermediate frequency band signals is necessary. In addition, because the local oscillation signal itself is shared, one kind of frequency can be used as the local oscillation signal.

SUMMARY

In cases where a plurality of circuit functional parts need a reference signal, there is a desire for a method of supplying the reference signal to each position while solving the problems of interference, noise, signal distortion, spurious radiation, usable frequencies and the like. However, the desire is not met in an actual situation.

The present disclosure has been made in view of the above situation. There is a first desire for providing a mechanism that can supply a reference signal to each position while solving the problems of interference and noise. In addition, there is a second desire for providing a mechanism that can supply a reference signal to each position while solving the problems of signal distortion and spurious radiation. Further, there is a third desire for providing a mechanism that enables a plurality of frequencies to be used as reference signals. Incidentally, there is preferably a desire for providing a mechanism that can simultaneously satisfy arbitrary combinations of the above three desires. In addition, there is preferably a desire for providing a mechanism that can properly set the respective levels of a processed signal processed on the basis of a reference signal and the reference signal to be used on a subsequent stage side.

A signal transmission system according to an embodiment of the present disclosure to be described in the following includes a reference signal transmission system, a radio transmission system, and a communication system. A signal processing device to be described in the following includes a communicating device. The communicating device includes a transmitting device, a receiving device, and a transmitting and receiving device in which a transmitting device and a receiving device are combined with each other. A signal transmission method to be described in the following includes a reference signal transmitting method, a radio transmission method, and a communicating method.

According to an embodiment of the present disclosure, there is a signal transmission system including:

a first signal processing section configured to perform signal processing on a basis of a reference signal;

a high-frequency reference signal generating section configured to generate and transmit a high-frequency reference signal having a higher frequency than the reference signal such that the high-frequency reference signal is synchronized with the reference signal;

a low-frequency reference signal generating section configured to receive the high-frequency reference signal from the high-frequency reference signal generating section, and generate a low-frequency reference signal having a lower frequency than the high-frequency reference signal such that the low-frequency reference signal is synchronized with the received high-frequency reference signal; and a second signal processing section configured to perform signal processing on a basis of the low-frequency reference signal generated by the low-frequency reference signal generating section.

According to another embodiment of the present disclosure, there is a reference signal transmitting device including a high-frequency reference signal generating section configured to generate and transmit a high-frequency reference signal having a higher frequency than a reference signal used in signal processing of a first signal processing section such that the high-frequency reference signal is synchronized with the reference signal.

According to further embodiment of the present disclosure, there is a signal processing device including:

a first signal processing section configured to perform signal processing on a basis of a reference signal;

a high-frequency reference signal generating section configured to generate and transmit a high-frequency reference signal having a higher frequency than the reference signal such that the high-frequency reference signal is synchronized with the reference signal; and a low-frequency reference signal generating section configured to receive the high-frequency reference signal from the high-frequency reference signal generating section, and generate a low-frequency reference signal having a lower frequency than the high-frequency reference signal such that the low-frequency reference signal is synchronized with the received the high-frequency reference signal.

According to still further embodiment of the present disclosure, there is a reference signal receiving device including a low-frequency reference signal generating section configured to receive a high-frequency reference signal synchronized with a reference signal used in signal processing of a first signal processing section and having a higher frequency than the reference signal, and generate a low-frequency reference signal having a lower frequency than the high-frequency reference signal such that the low-frequency reference signal is synchronized with the received high-frequency reference signal.

According to an embodiment of the present disclosure, there is a signal processing device including:

a low-frequency reference signal generating section configured to receive a high-frequency reference signal synchronized with a reference signal used in signal processing of a first signal processing section and having a higher frequency than the reference signal, and generate a low-frequency reference'signal having a lower frequency than the high-frequency reference signal such that the low-frequency reference signal is synchronized with the received high-frequency reference signal; and a second signal processing section configured to perform signal processing on a basis of the low-frequency reference signal generated by the low-frequency reference signal generating section.

According to an embodiment of the present disclosure, there is an electronic device including:

a first signal processing section configured to perform signal processing on a basis of a reference signal;

a high-frequency reference signal generating section configured to generate and transmit a high-frequency reference signal having a higher frequency than the reference signal such that the high-frequency reference signal is synchronized with the reference signal;

a low-frequency reference signal generating section configured to receive the high-frequency reference signal from the high-frequency reference signal generating section, and generate a low-frequency reference signal having a lower frequency than the high-frequency reference signal such that the low-frequency reference signal is synchronized with the received high-frequency reference signal; and a second signal processing section configured to perform signal processing on a basis of the low-frequency reference signal generated by the low-frequency reference signal generating section.

According to an embodiment of the present disclosure, there is a signal transmission method including:

generating and transmitting a high-frequency reference signal having a higher frequency than a reference signal used in signal processing of a first signal processing section such that the high-frequency reference signal is synchronized with the reference signal; and receiving the high-frequency reference signal, and generating a low-frequency reference signal having a lower frequency than the high-frequency reference signal such that the low-frequency reference signal is synchronized with the received the high-frequency reference signal.

By interposing the high-frequency reference signal and the low-frequency reference signal, the low-frequency reference signal synchronized with the first reference signal used by the first signal processing section can be transmitted to each position. It suffices to set the frequency of the low-frequency reference signal by a multiplication number or a frequency dividing ratio. Because these setting values have a degree of freedom, a plurality of frequencies can be used by the first signal processing section and the second signal processing section, respectively, while the first reference signal used by the first signal processing section and the low-frequency reference signal used by the second signal processing section are made synchronous with each other.

The high-frequency reference signal may be transmitted by radio or by wire. However, when the high-frequency reference signal is transmitted by radio, the problems of signal distortion and spurious radiation can be solved.

The first signal processing section performs signal processing on the basis of the first reference signal. The second signal processing section performs signal processing on the basis of the low-frequency reference signal. For example, in a case of application to communication processing, the transmitting device sets the first reference signal as a carrier signal for modulation and uses the carrier signal for modulation processing, and the receiving device sets the low-frequency reference signal as a carrier signal for demodulation and uses the carrier signal for demodulation processing.

The high-frequency reference signal synchronized with the first reference signal is transmitted, and the low-frequency reference signal synchronized with the high-frequency reference signal is generated on the side where the high-frequency reference signal is received. The second signal processing section performs signal processing on the basis of the low-frequency reference signal. Because the low-frequency reference signal is synchronized with not only the high-frequency reference signal but also the first reference signal, the second signal processing section can achieve signal processing synchronized with the first reference signal.

Because the low-frequency reference signal is generated on the basis of the high-frequency reference signal synchronized with the first reference signal, a need for each chip to have a reference signal generating section such as a crystal oscillator or the like is eliminated.

In a case of application to communication processing, when the high-frequency reference signal having a higher frequency than the first reference signal used as a carrier signal for modulation is transmitted together with a modulated signal, the respective levels of the modulated signal and the high-frequency reference signal can be set separately from each other so as to be suitable for the respective signals.

According to a mode of the present disclosure, it is possible to transmit the high-frequency reference signal synchronized with the reference signal used by the first signal processing section to each position, and solve the problems of interference and noise. In addition, the respective levels of a processed signal processed by the first signal processing section on the basis of the first reference signal and the high-frequency reference signal synchronized with the first reference signal and having a higher frequency than the first reference signal can be set separately from each other so as to be appropriate for the respective signals.

According to another mode of the present disclosure, when the high-frequency reference signal is transmitted by radio, the problems of signal distortion and spurious radiation can be solved.

According to another mode of the present disclosure, the frequency of the reference signal used by the first signal processing section and the low-frequency reference signal used by the second signal processing section can be made to be a plurality of frequencies.

BRIEF DESCRIPTION OF THE DRAWINGS

FIGS. 9A to 9C are diagrams of assistance in explaining a fourth comparative example;

DETAILED DESCRIPTION OF THE PREFERRED EMBODIMENTS

Preferred embodiments of the present disclosure will hereinafter be described in detail with reference to the drawings. When each functional element is distinguished by form, the functional element will be described with a capital alphabetical reference such as A, B, . . . attached thereto. The reference will be omitted when each functional element is described without being particularly distinguished. The same is true for the drawings.

Description will be made in the following order.
1. Communication System: General Outlines
2. Reference Signal Transmission System
3. Radio Transmission System: First Embodiment, Second Embodiment, and Summary
4. Summary of First Embodiment
5. Communication System: Second Embodiment
6. Comparison with Comparative Examples
7. Examples of Application to Electronic Devices (First to Third Examples)
8. Examples of Application to Radio Transmission Systems (First to Fourth Examples of Application)
9. Phase Uncertainty and Measures against Phase Uncertainty <Communication System: General Outlines>

Figure 1:
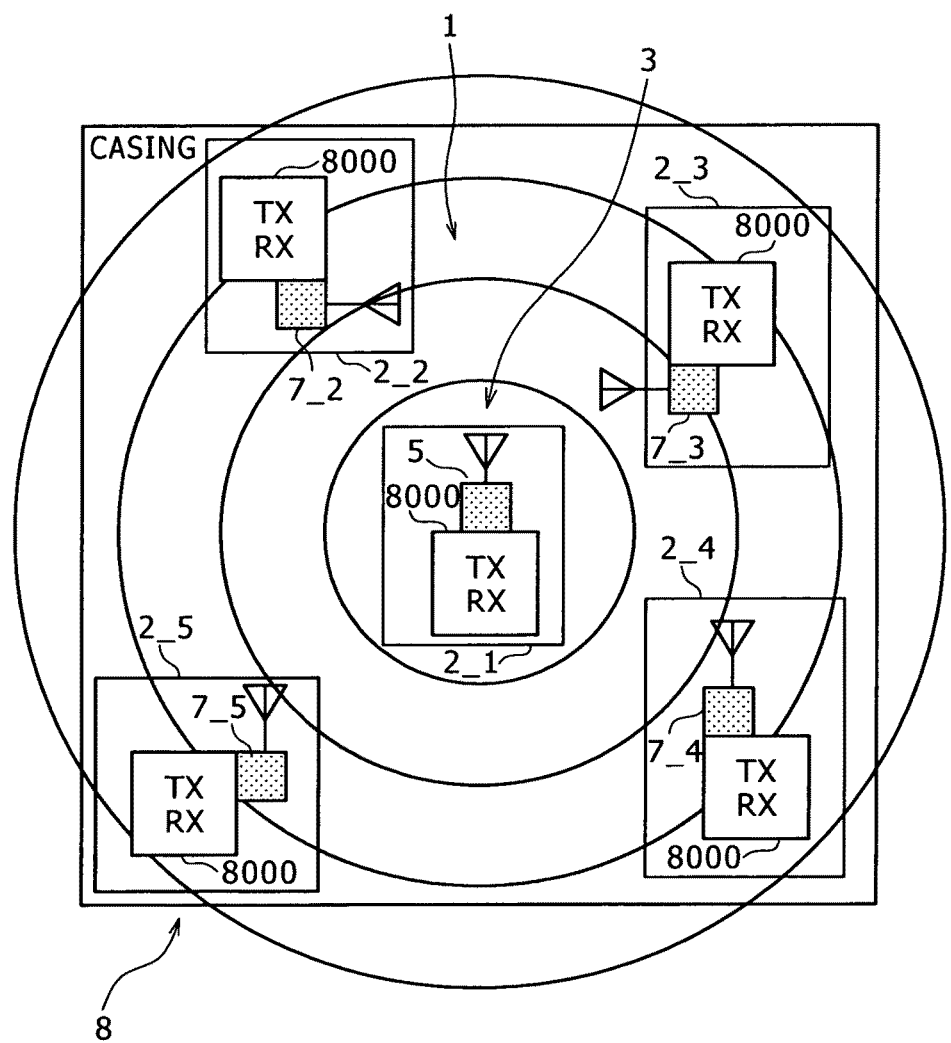
FIG. 1 is a diagram of assistance in explaining general outlines of a reference signal transmission system according to a present embodiment.

FIG. 1 is a diagram of assistance in explaining general outlines of a reference signal transmission system according to a present embodiment. The reference signal transmission system 3 according to the present embodiment is an example applied to a communication system 8.

The communication system 8 includes a radio transmission system 1 (signal transmission system) including a plurality of communicating devices 2 for transmitting a transmission object signal by radio and the reference signal transmission system 3. The communicating devices 2 have a communication chip 8000. The communication chip 8000 may be one or both of a transmitting chip 8001 (TX) and a receiving chip 8002 (RX) to be described later, or the functions of both the transmitting chip 8001 and the receiving chip 8002 may be provided within one chip to be ready for bidirectional communication.

The reference signal transmission system 3 includes a reference signal transmitting device 5 for transmitting a reference signal (a carrier signal and a local oscillation signal in this example) to be used by the communicating devices 2 by radio and a reference signal receiving device 7. The reference signal transmitting device 5 is provided so as to be incorporated in one of the communicating devices 2. In the example of FIG. 1, the reference signal transmitting device 5 is incorporated in one communicating device 2_1 of five communicating devices 2_1 to 2_5. The one communicating device 2 having the reference signal transmitting device 5 incorporated therein does not have to have the reference signal receiving device 7. As a preferable mode, the communication chip 8000 and the reference signal transmitting device 5 or the reference signal receiving device 7 are incorporated in the communicating devices 2, as shown in FIG. 1.

Suppose in this case that the band of a carrier frequency used for signal transmission by each communicating device 2 and the band of a carrier frequency used for the transmission of the reference signal between the reference signal transmitting device 5 and each reference signal receiving device 7 are both a millimeter wave band.

In the example shown in FIG. 1, five communicating devices 2_1 to 2_5, one reference signal transmitting device 5, and four reference signal receiving devices 7_2 to 7_5 are housed within the casing of one electronic device. However, the number of communicating devices 2 installed and the number of reference signal receiving devices 7 installed are not limited to four or five, and it is not essential that these devices be housed within the casing of one electronic device.

In the example of FIG. 1, one antenna is shared with attention directed to the use of frequencies in the same millimeter wave band by the communicating devices 2, the reference signal transmitting device 5, and the reference signal receiving devices 7. However, this is not essential. For example, when a communication band used by the communicating devices 2 is different from a communication band used by the reference signal transmitting device 5 and the reference signal receiving devices 7 as in a case where a band of lower frequencies than the millimeter wave band is used between the communicating devices 2 and the millimeter wave band is used between the reference signal transmitting device 5 and the reference signal receiving devices 7, antennas suitable for the respective communication bands are desirably used separately from each other.

In the example of FIG. 1, the communication chips 8000, the reference signal transmitting device 5, and the reference signal receiving devices 7 are shown as respective separate functional parts. However, as a preferable mode, the communication chips 8000 are desirably configured to include the functional parts of the reference signal transmitting device 5 and the reference signal receiving devices 7.

<Reference Signal Transmission System>

Figure 2:
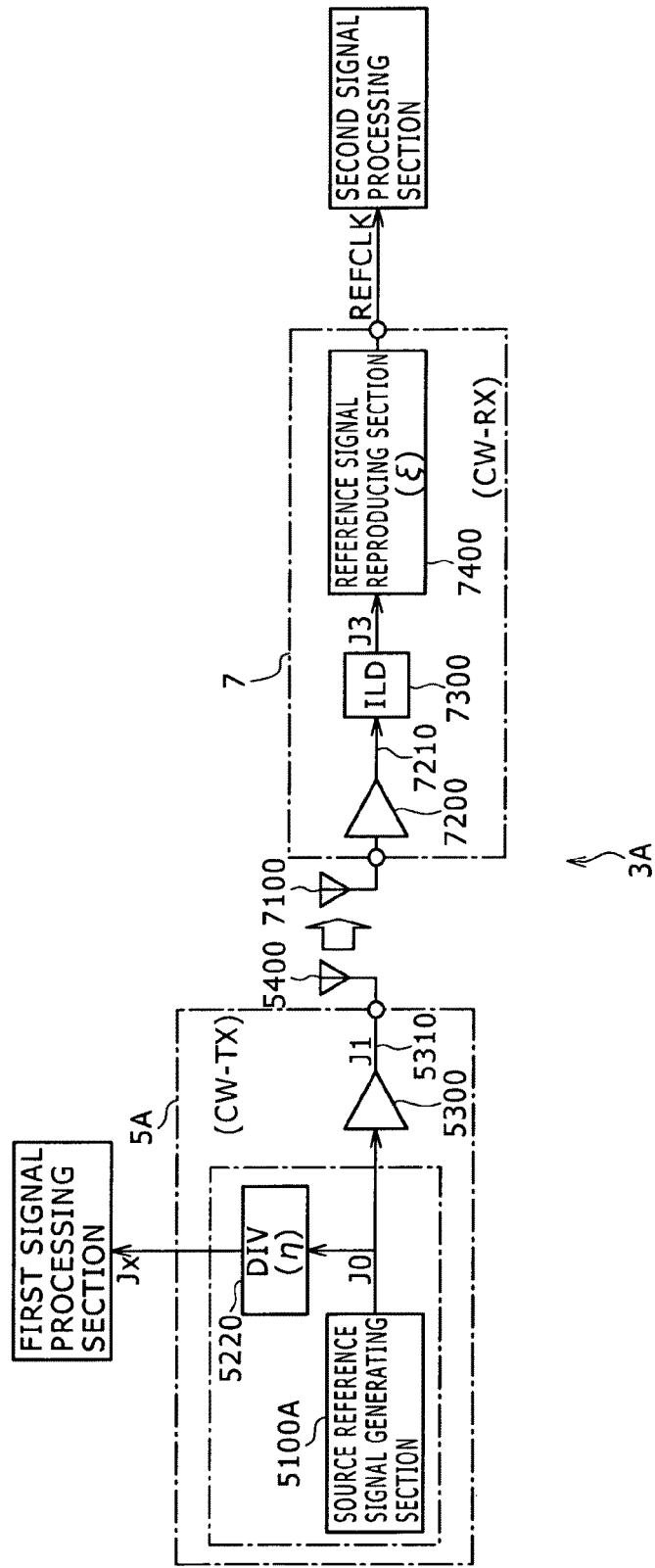
FIG. 2 is a diagram of assistance in explaining a basic configuration (first example) of the reference signal transmission system.
Figure 3:
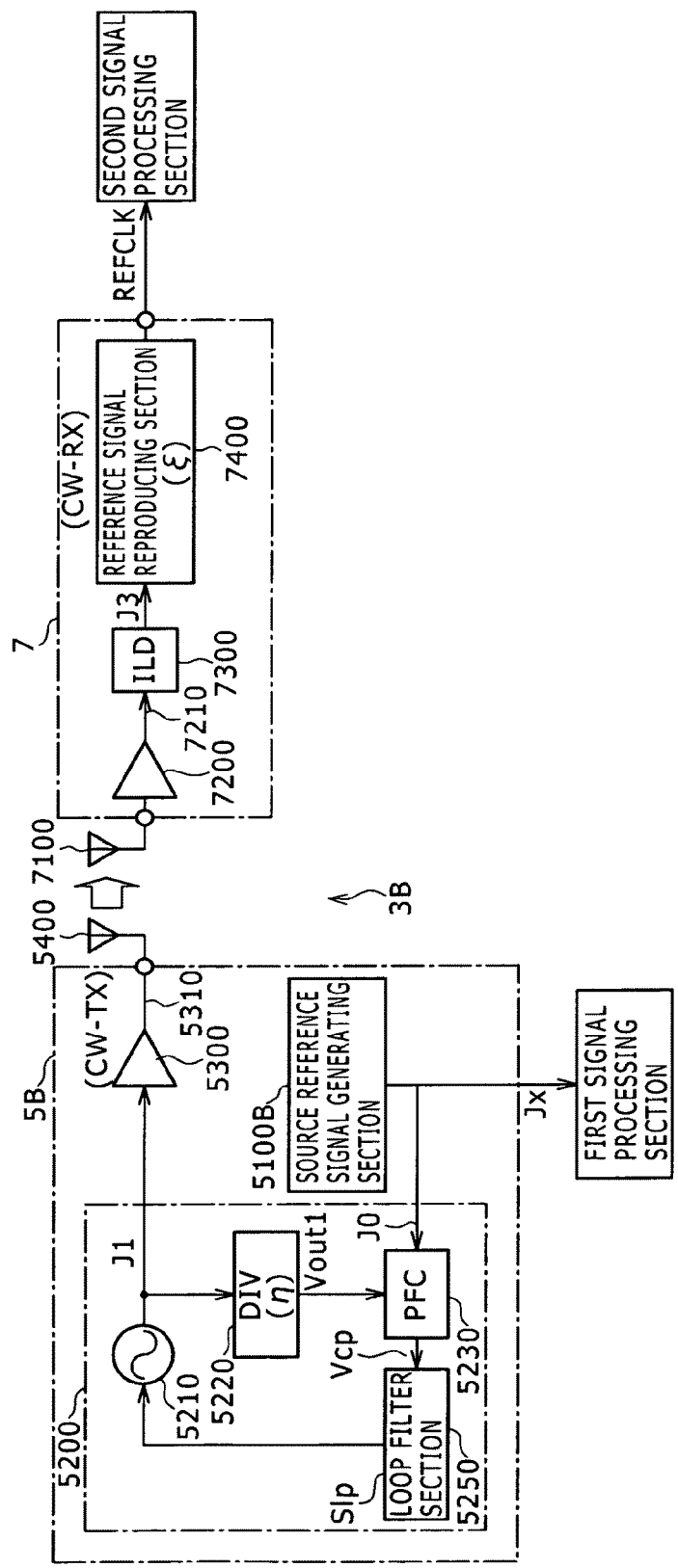
FIG. 3 is a diagram of assistance in explaining a basic configuration (second example) of the reference signal transmission system.

FIG. 2 and FIG. 3 are diagrams of assistance in explaining basic configurations of the reference signal transmission system 3. A first communicating device 2 as an example of a first electronic device including a first signal processing section includes a reference signal transmitting device 5 for generating a source reference signal J0 and a multiplied reference signal J1.

In this case, a reference signal transmission system 3A in a first example is a configuration using the source reference signal J0 as the multiplied reference signal J1 itself and using a signal obtained by frequency-dividing the source reference signal J0 as a reference signal Jx for the signal processing of the first signal processing section. The multiplied reference signal J1 is an example of a high-frequency reference signal synchronized with the reference signal Jx used by the first signal processing section and having a higher frequency than the reference signal Jx. In this case, the reference signal transmitting device 5A includes a source reference signal generating section 5100A having a function of a multiplied reference signal generating section, an amplifying section 5300, and an antenna 5400.

The source reference signal generating section 5100A generates the source reference signal J0 as a timing signal of a frequency in the millimeter wave band. As an example, the source reference signal generating section 5100A may employ a configuration similar to that of a multiplied reference signal generating section 5200 to be described later. This is based on a fact that it is not easy to directly generate the source reference signal J0 of a frequency in the millimeter wave band by a crystal oscillator (XTAL) or the like. The frequency-divided reference signal generating section 5110 frequency-divides the source reference signal J0 of a frequency in the millimeter wave band into a timing signal in a frequency band usable for signal processing.

The amplifying section 5300 amplifies the source reference signal J0 output from the source reference signal generating section 5100A as the multiplied reference signal J1 itself, and supplies the multiplied reference signal J1 to a transmission line coupling section 5310 connected to the antenna 5400.

The reference signal transmitting device 5A in the first example functions as a reference signal transmitter that uses the source reference signal J0 generated by the source reference signal generating section 5100A as the multiplied reference signal J1 and which transmits the multiplied reference signal J1 using the antenna 5400 of a small size.

A reference signal transmission system 3B in a second example shown in FIG. 3 is a configuration in which a source reference signal J0 is used as a reference signal Jx for signal processing by a first signal processing section and the source reference signal J0 is multiplied into a multiplied reference signal J1. In this case, the reference signal transmitting device 5B includes a source reference signal generating section 5100B, a multiplied reference signal generating section 5200, an amplifying section 5300, and an antenna 5400.

The source reference signal generating section 5100B generates the source reference signal J0. For example, the source reference signal generating section 5100B generates the source reference signal J0 of a frequency fck by a crystal oscillator (XTAL) or the like.

The multiplied reference signal generating section 5200 generates a timing signal in the millimeter wave band by multiplying the frequency of the source reference signal J0 into a frequency in the millimeter wave band, that is, converts the source reference signal J0 into the multiplied reference signal J1 in the millimeter wave band. The multiplied reference signal J1 is an example of a high-frequency reference signal. The multiplied reference signal generating section 5200 is an example of a high-frequency reference signal generating section for generating a high-frequency reference signal (multiplied reference signal J1) of a higher frequency than that of the source reference signal J0 on the basis of the source reference signal J0 generated in the source reference signal generating section 5100.

It suffices for the multiplied reference signal generating section 5200 to be able to generate the high-frequency reference signal (multiplied reference signal J1) synchronized with the source reference signal J0 (reference signal Jx itself) and having a higher frequency than the source reference signal J0. The multiplied reference signal generating section 5200 can employ various circuit configurations. However, the multiplied reference signal generating section 5200 is suitably formed by for example a PLL (phase-locked loop) or a DLL (Delay-Locked Loop). The multiplied reference signal generating section 5200 may modulate a carrier signal Lo with the source reference signal J0 and thereby generate the multiplied reference signal J1 as a so-called unmodulated carrier by a configuration similar to that of a modulating functional part 8300 to be described later. Description in the following will be made supposing that the multiplied reference signal generating section 5200 has a PLL configuration.

The multiplied reference signal generating section 5200 of a PLL configuration includes an oscillating section 5210 (OSC), a frequency dividing section 5220 (DIV: feedback frequency divider), a phase and frequency comparing section 5230 (PFD), and a loop filter section 5250.

It suffices for the oscillating section 5210 to be able to generate a high-frequency signal in the millimeter wave band. Either of a signal voltage controlled oscillating circuit (VCO:

Voltage Controlled Oscillator) and a current controlled oscillating circuit (CCO: Current Controlled Oscillator), for example, may be employed as the oscillating section 5210.

The frequency dividing section 5220 is provided to realize a multiplying function. The frequency dividing section 5220 divides the oscillation frequency Fosc of an output oscillation signal Vout (=the multiplied reference signal J1) output from the oscillating section 5210 into $1/\eta$, and thereby obtains a frequency-divided oscillation signal Vout1 as an example of a comparison clock signal. $\eta$ is a PLL multiplication number (referred to also as a frequency dividing ratio), is a positive integer of one or more, and is desirably made variable so that the frequency of the multiplied reference signal J1 as a PLL output clock can be changed.

The phase and frequency comparing section 5230 compares the phases and the frequencies of the source reference signal J0 (external reference clock) supplied from the source reference signal generating section 5100 and the frequency-divided oscillation signal Vout1 from the frequency dividing section 5220 with each other, and generates a comparison result signal Vcp as an error signal indicating a phase difference and a frequency difference as a result of the comparison.

An output stage of the phase and frequency comparing section 5230 has a charge pump section as an example. The charge pump section inputs or outputs a driving current (referred to as a charge pump current Icp) according to the comparison result signal Vcp. The charge pump section includes for example a charge pump for inputting or outputting the charge pump current Icp and a current source of a variable current value type for supplying a bias current Icp-bias to the charge pump.

The loop filter section 5250 is an example of a smoothing section for smoothing the comparison signal output from the phase and frequency comparing section 5230 via the charge pump section. The loop filter section 5250 includes for example a low-pass filter LPF as a filter circuit. The loop filter section 5250 integrates the charge pump current Icp generated by the charge pump section by the filter circuit, and generates a loop filter output signal S1$p$ for controlling the oscillation frequency Fosc of the oscillating section 5210.

The loop filter section 5250 has an output stage thereof corresponding to the oscillating section 5210 so as to be adapted to the oscillating section 5210. For example, when the oscillating section 5210 is formed by a current controlled oscillating circuit, the loop filter section 5250 is specifically provided with a voltage-to-current converting section in a stage subsequent to the filter circuit in order to be of a current output type. When the oscillating section 5210 is formed by a voltage controlled oscillating circuit, it suffices for the loop filter section 5250 to be of a voltage output type, and it is not necessary to provide a voltage-to-current converting section in a stage subsequent to the filter circuit.

The amplifying section 5300 amplifies the multiplied reference signal J1 in the millimeter wave band after frequency conversion, and supplies the amplified multiplied reference signal J1 to the transmission line coupling section 5310 connected to the antenna 5400.

The reference signal transmitting device 5B in the second example functions as a reference signal transmitter that supplies the source reference signal J0 generated in the source reference signal generating section 5100B as the reference signal Jx to be used by the first signal processing section, which converts the source reference signal J0 into the multiplied reference signal J1 in the millimeter wave band by multiplying the source reference signal J0 in the multiplied reference signal generating section 5200, and which transmits the multiplied reference signal J1 using the antenna 5400 of a small size.

In each of the first example and the second example, the reference signal receiving device 7 (CW-RX) includes an antenna 7100, an amplifying section 7200, a multiplied reference signal reproducing section 7300, and a reference signal reproducing section 7400 (DIV).

The multiplied reference signal J1 in the millimeter wave band which signal is received by the antenna 7100 is supplied to the amplifying section 7200 via a transmission line coupling section 7210. The amplifying section 7200 amplifies the multiplied reference signal J1 in the millimeter wave band, and supplies the amplified multiplied reference signal J1 to the multiplied reference signal reproducing section 7300.

The multiplied reference signal reproducing section 7300 extracts a multiplied reference signal J3 that is completely identical in frequency and phase to the multiplied reference signal J1 on the transmitting side, that is, frequency-synchronized and phase-synchronized with the multiplied reference signal J1, and supplies the multiplied reference signal J3 to the reference signal reproducing section 7400. Incidentally, being "completely identical in frequency and phase to the multiplied reference signal J1 on the transmitting side" is not essential. It suffices to achieve at least phase synchronization, and the frequency of the multiplied reference signal J3 may be different from that of the multiplied reference signal J1 in some cases.

The multiplied reference signal reproducing section 7300 may be of various configurations. However, for example, the multiplied reference signal reproducing section 7300 may adopt a system that generates a line spectrum coinciding with the multiplied reference signal J1 equivalent to an unmodulated carrier, which inputs the line spectrum to a resonant circuit or an injection locking frequency divider (ILD) circuit, and which reproduces a signal having an integral submultiple of the frequency of the multiplied reference signal J1 ($1/\xi\_1$). FIGS. 2 and 3 represent a case of using an injection locking system. A simple and low-power-consumption circuit can be formed by using the injection locking system as a section for frequency-dividing the multiplied reference signal J1.

The reference signal reproducing section 7400 divides the frequency of the multiplied reference signal J3 reproduced by the multiplied reference signal reproducing section 7300 into $1/\xi\_2$, and supplies the result as a reference signal REFCLK to the communicating device 2. $\xi\_2$ is a multiplication number (referred to also as a frequency dividing ratio), and is desirably made variable so as to be able to change the frequency of the reference signal REFCLK. The multiplied reference signal J1 is frequency-divided into $1/\xi$ by a combination of $1/\xi\_1$ of the multiplied reference signal reproducing section 7300 and $1/\xi\_2$ of the reference signal reproducing section 7400. In FIGS. 2 and 3, this "$1/\xi$" is collectively written in the reference signal reproducing section 7400. The reference signal REFCLK is an example of a low-frequency reference signal. The reference signal reproducing section 7400 is an example of a low-frequency reference signal generating section for generating a low-frequency reference signal (reference signal REFCLK) having a lower frequency than the high-frequency reference signal (multiplied reference signal J1) generated in the multiplied reference signal generating section 5200. In the present example, it can also be considered that the multiplied reference signal reproducing section 7300 and the reference signal reproducing section 7400 form the low-frequency reference signal generating section. When the multiplied reference signal J3 generated in the multiplied reference signal reproducing section 7300 can be used as the reference signal REFCLK, the reference signal reproducing section 7400 does not have to be provided, and the multiplied reference signal reproducing section 7300 singly forms the low-frequency reference signal generating section.

The frequency of the reference signal REFCLK used by each communicating device 2 does not have to be the same, and it suffices to determine the multiplication number ξ so as to obtain a frequency necessary for each communicating device 2. It is not essential to make the multiplication number ξ on the receiving side coincide with the multiplication number on the transmitting side, and the reference signal receiving devices 7 corresponding to the respective communicating devices 2 may each have a different value.

The reference signal receiving device 7 of such a constitution functions as a reference signal receiver that receives the multiplied reference signal J1 in the millimeter wave band by the antenna 7100 of a small size, and which reproduces the reference signal REFCLK by frequency-dividing the multiplied reference signal J3 reproduced in the multiplied reference signal reproducing section 7300 by the reference signal reproducing section 7400.

The reference signal transmission system 3 formed by such a reference signal transmitting device 5 and such a reference signal receiving device 7 is a system such that a frequency-synchronized reference signal can be transmitted by radio.

In this example, the reference signal is made common as the multiplied reference signal J1, and the multiplied reference signal J1 is transmitted to each position. Thus, interference is eliminated, and there is no need for measures against noise. In addition, in this example, because the multiplied reference signal J1 is transmitted to each position by radio, electric wiring is not necessary, and the multiplied reference signal J1 can be supplied to each position while the problems of signal distortion and spurious radiation are solved. Further, in this example, the reference signal REFCLK of a frequency necessary for each position can be prepared on the basis of the multiplied reference signal J3. Thus, the frequency usable as the reference signal can be made to correspond to each second signal processing section (communicating device 2, for example).

In this example, a functional part for dividing the frequency of the multiplied reference signal J3 into 1/ξ is provided on the side of the reference signal receiving device 7. However, an identical functional part may be provided on the side of the second signal processing section without the functional part being provided on the side of the reference signal receiving device 7. In addition, the reference signal reproducing section 7400 may be provided in the reference signal receiving device 7, and a functional part for realizing another multiplication number ξ may be provided on the side of the second signal processing section.

<Radio Transmission System>
[First Embodiment]

Figure 4:
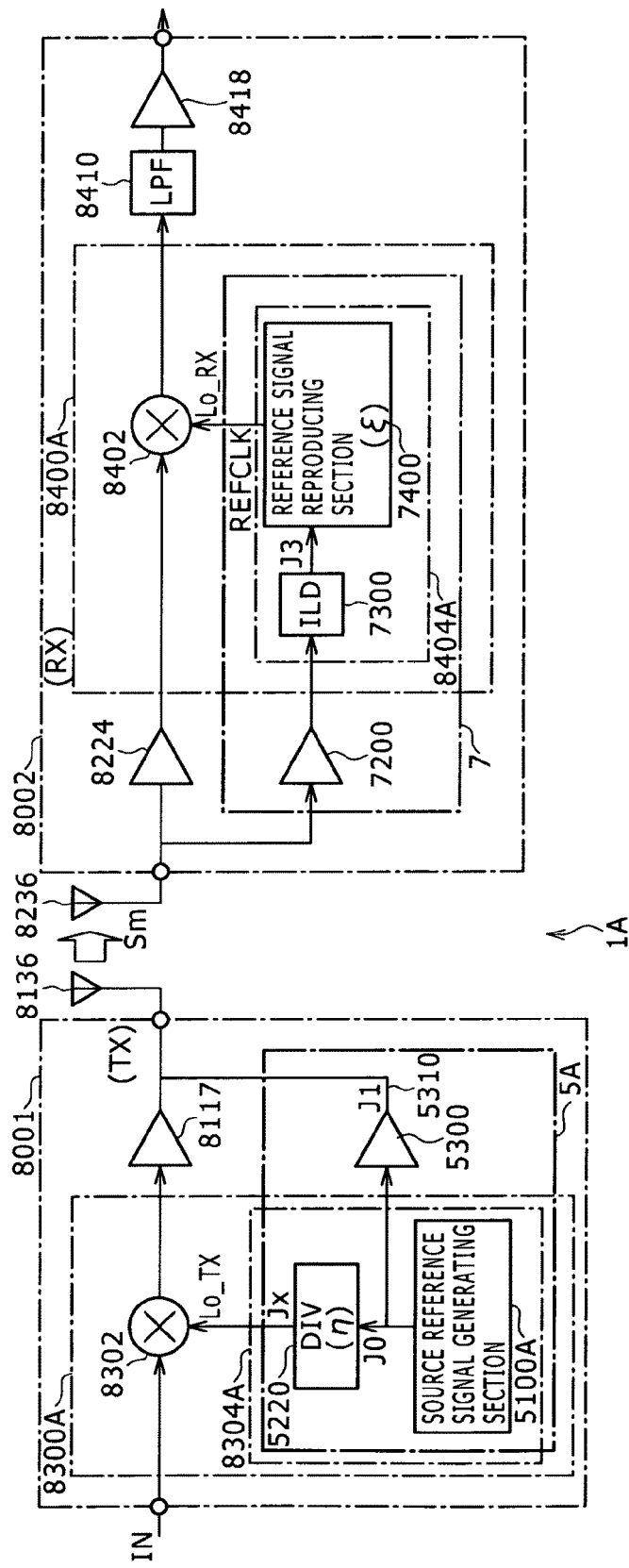
FIG. 4 is a diagram of assistance in explaining a modulating functional part and a demodulating functional part of a radio transmission system according to a first embodiment.

FIG. 4 is a diagram of assistance in explaining a modulating functional part and a demodulating functional part of a radio transmission system 1A according to a first embodiment.

A transmitting chip 8001 (TX) that needs a carrier signal Lo_TX as an example of the reference signal Jx and a receiving chip 8002 (RX) that needs a carrier signal Lo_RX as an example of the reference signal REFCLK form the basis of the radio transmission system 1A (communication system). The transmitting chip 8001 has a modulating functional part 8300A and an amplifying section 8117. The receiving chip 8002 has an amplifying section 8224, a demodulating functional part 8400A, a filter processing section 8410, and a buffer section 8418.

[Modulating Functional Part]

A signal as an object of transmission (baseband signal: for example a 12-bit image signal) is converted into a high-speed serial data series by a signal generating section not shown in the figure, and then supplied to the modulating functional part 8300A. The modulating functional part 8300A is an example of a signal processing section for performing signal processing on the basis of the reference signal REFCLK (low-frequency reference signal). The modulating functional part 8300A sets a signal from a parallel-serial converting section as a modulating signal, and modulates the signal into a signal in the millimeter wave band according to a predetermined modulation system.

The modulating functional part 8300A can employ various circuit configurations according to the modulation system. For example, when the modulation system modulates amplitude, it suffices for the modulating functional part 8300A to employ a configuration including a two-input type frequency mixing section 8302 (a mixer circuit or a multiplier) and a transmitting side local oscillating section 8304A. The radio transmission system 1A according to the first embodiment employs an ASK system (uniaxial modulation system).

The transmitting side local oscillating section 8304A (first carrier signal generating section) is formed by using the reference signal transmitting device 5A in the first example or the reference signal transmitting device 5B in the second example. The transmitting side local oscillating section 8304A supplies the carrier signal Lo_TX (modulation carrier signal) used for modulation as an example of the reference signal Jx to the frequency mixing section 8302. FIG. 4 represents a case in which the reference signal transmitting device 5A in the first example is adopted.

The frequency mixing section 8302 (first frequency converting section) multiplies (modulates) the carrier signal Lo_TX in the millimeter wave band which carrier signal is generated by the transmitting side local oscillating section 8304A by the signal from the parallel-serial converting section, thereby generating a transmission signal (modulated signal) in the millimeter wave band, and supplies the transmission signal to the amplifying section 8117. The transmission signal is amplified by the amplifying section 8117, and radiated as a radio signal Sm in the millimeter wave band from the antenna 8136. A multiplied reference signal J1 output from the reference signal transmitting device 5 is amplified by an amplifying section 5300, and radiated from the same antenna 8136 as the modulated signal. The multiplied reference signal J1 may be radiated from a separate antenna 5400 without using the same antenna 8136 as the modulated signal.

The amplifying section 8117 for data transmission and the amplifying section 5300 for the transmission of a high-frequency reference signal (multiplied reference signal J1) may be realized by one amplifying section. In that case, however, an amplifier circuit with a very wide band may be necessary. On the other hand, amplifier circuits suitable for the respective bands can be used by providing the separate amplifying sections as in the example shown above.

[Demodulating Functional Part]

The demodulating functional part 8400 is an example of a second signal processing section for performing demodulation signal processing on a processed signal (modulated signal) processed by the modulating functional part 8300 as an example of a first signal processing section on the basis of the low-frequency reference signal frequency-synchronized with the transmitting side.

The demodulating functional part 8400A can employ various circuit configurations in a range corresponding to the modulation system on the transmitting side. In this case, however, description will be made of a case where the demodulating functional part 8400A employs an ASK system as a system of modulating amplitude so as to correspond to the above description of the modulating functional part 8300A.

The demodulating functional part 8400A is an example of a signal processing section for performing signal processing on the basis of the reference signal REFCLK (low-frequency reference signal). The demodulating functional part 8400A includes a two-input type frequency mixing section 8402 (a mixer circuit or a multiplier) and a receiving side local oscillating section 8404A. The demodulating functional part 8400A performs signal demodulation by a so-called synchronous detection system from a received signal received by an antenna 8236. In the synchronous detection system, a carrier wave is reproduced by the receiving side local oscillating section 8404A separate from the frequency mixing circuit 8402, and demodulation is performed using the reproduced carrier wave. In communication using synchronous detection, carrier signals for transmission and reception have to be frequency-synchronized and phase-synchronized with each other.

In the example shown in FIG. 4, a filter processing section 8410 and a buffer section 8418 are provided in a stage subsequent to the frequency mixing circuit 8402. The filter processing section 8410 includes for example a low-pass filter (LPF). The filter processing section 8410 removes a harmonic component included in multiplication output.

The buffer section 8418 performs a function of an interface with a subsequent stage circuit (a signal generating section and a signal reproducing section) not shown in FIG. 4. The subsequent stage circuit includes for example a clock reproducing section (CDR: Clock Data Recovery) and a serial-parallel converting section.

The received signal received by the antenna 8236 is input to an amplifying section 8224 (LNA) of a variable gain type and a low noise type to be adjusted in amplitude, and then supplied to the demodulating functional part 8400A. The received signal adjusted in amplitude is input to the frequency mixing circuit 8402, and a multiplication signal is generated by synchronous detection in the frequency mixing circuit 8402 and then supplied to the filter processing section 8410. The waveform (baseband signal) of the input signal sent from the transmitting side is generated by removing the high-frequency component of the multiplication signal generated by the frequency mixing circuit 8402 in the low-pass filter of the filter processing section 8410. The baseband signal is supplied to the clock reproducing section not shown in FIG. 4 via the buffer section 8418.

The clock reproducing section reproduces a sampling clock on the basis of the baseband signal, samples the baseband signal with the reproduced sampling clock, and thereby generates a received data series. The generated received data series is supplied to the serial-parallel converting section not shown in FIG. 4, so that a parallel signal (for example a 12-bit image signal) is reproduced. A clock reproducing system includes various systems. However, a symbol synchronization system, for example, is adopted.

The receiving side local oscillating section 8404A is formed by using the reference signal receiving device 7. The receiving side local oscillating section 8404A supplies the reference signal REFCLK reproduced in the reference signal receiving device 7 as a carrier signal (reproduced carrier signal Lo_RX) for demodulation to the frequency mixing circuit 8402.

The amplifying section 8224 for data transmission and the amplifying section 7200 for the transmission of the high-frequency reference signal (multiplied reference signal J1) may be realized by one amplifying section. In that case, however, an amplifier circuit with a very wide band is necessary. On the other hand, amplifier circuits suitable for the respective bands can be used by providing the separate amplifying sections as in the example shown above.

[Second Embodiment]

Figure 5:
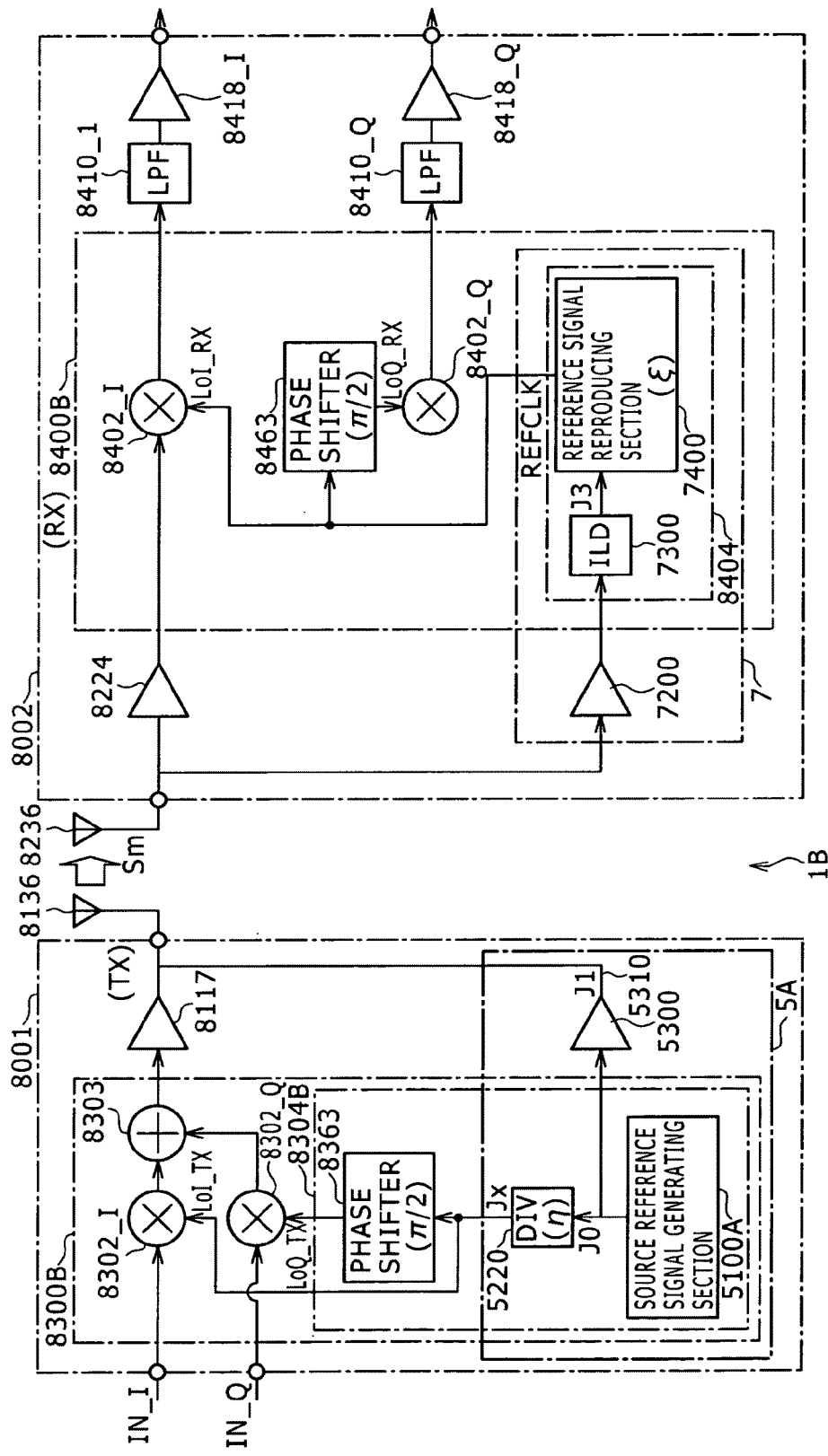
FIG. 5 is a diagram of assistance in explaining a modulating functional part and a demodulating functional part of a radio transmission system according to a second embodiment.

FIG. 5 is a diagram of assistance in explaining a modulating functional part and a demodulating functional part of a radio transmission system 1B according to a second embodiment. A difference from the radio transmission system 1A according to the first embodiment lies in that a QPSK system (biaxial modulation system) is adopted in place of the ASK system (uniaxial modulation system). Description in the following will be made of differences from the first embodiment.

A modulating functional part 8300B includes a frequency mixing section 8302_I for modulating a signal IN_I of an I-axis component, a frequency mixing section 8302_Q for modulating a signal IN_Q of a Q-axis component, a transmitting side local oscillating section 8304B using the reference signal transmitting device 5A, and a modulated signal synthesizing section 8303, so as to form a quadrature modulation circuit.

The transmitting side local oscillating section 8304B has a phase shifter 8363 for shifting the phase of a reference signal Jx output from the reference signal transmitting device 5A by 90 degrees ($\pi/2$). The frequency mixing section 8302_I is supplied with the reference signal Jx output from the reference signal transmitting device 5 as a carrier signal LoI_TX. The frequency mixing section 8302_Q is supplied with the reference signal Jx output from the reference signal transmitting device 5 as a carrier signal LoQ_TX after being shifted by $\pi/2$ in the phase shifter 8363. Transmission signals (modulated signals) in the millimeter wave band which signals have been respectively modulated in the frequency mixing section 8302_I and the frequency mixing section 8302_Q are supplied to the modulated signal synthesizing section 8303. The modulated signal synthesizing section 8303 synthesizes the respective modulated signals of the I-axis component and the Q-axis component, and supplies the result to an amplifying section 8117.

A demodulating functional part 8400B includes a frequency mixing circuit 8402_I for demodulating the I-axis component, a frequency mixing circuit 8402_Q for demodulating the Q-axis component, and a phase shifter 8463 for shifting the phase of a reference signal REFCLK output from a reference signal receiving device 7 by 90 degrees ($\pi/2$), so as to form a quadrature detection circuit. The frequency mixing circuit 8402_I is supplied with the reference signal REFCLK output from the reference signal receiving device 7 as a carrier signal LoI_RX. The frequency mixing circuit 8402_Q is supplied with the reference signal REFCLK output from the reference signal receiving device 7 as a carrier signal LoQ_RX after being shifted by $\pi/2$ in the phase shifter 8463. A filter processing section 8410_I and a buffer section 8418_I for the I-axis component are provided in order in a stage subsequent to the frequency mixing circuit 8402_I. A filter processing section 8410_Q and a buffer section 8418_Q for the Q-axis component are provided in order in a stage subsequent to the frequency mixing circuit 8402_Q.

[Summary of Radio Transmission System]

In each of the radio transmission systems 1 according to the first embodiment and the second embodiment, the transmitting chip 8001 has the reference signal transmitting device 5A including a high-frequency reference signal generating section for generating a first reference signal Jx (carrier signals Lo_TX, LoI_TX, and LoQ_TX) used as a local oscillation signal by the modulating functional part 8300 (first signal processing section) and a multiplied reference signal J1 (high-frequency reference signal) having an integral multiple of the frequency of the reference signal Jx. The transmitting chip 8001 as a transmitter performs modulation using the reference signal Jx as a local oscillation signal, and transmits the multiplied reference signal J1 having a frequency that is an integral multiple of the frequency used for the local oscillation signal together with a modulated signal.

In each of the radio transmission systems 1 according to the first embodiment and the second embodiment, the receiving chip 8002 has the reference signal receiving device 7 for generating a low-frequency reference signal (a multiplied reference signal J3 or a reference signal REFCLK) frequency-synchronized with the transmitting side by frequency-dividing the received multiplied reference signal J1. The receiving chip 8002 as a receiver receives the multiplied reference signal J1 and the modulated signal, and performs demodulation in the demodulating functional part 8400 using a local oscillation signal based on the low-frequency reference signal frequency-synchronized with the transmitting side, the low-frequency reference signal being generated by frequency-dividing the multiplied reference signal J1.

In the radio transmission system 1 according to the present embodiment, the reference signal REFCLK is generated by frequency-dividing the multiplied reference signal J1 (transmitted from the reference signal transmitting device 5) having an integral multiple of the frequency of the reference signal Jx on the receiving side. Thus, within a range in which the multiplied reference signal J1 having an integral multiple of the frequency of the reference signal Jx can be received, the frequency-synchronized reference signal REFCLK can be reproduced, and it is not necessary for each chip to have reference signal generating means such as a crystal oscillator or the like.

A special mechanism for achieving frequency synchronization other than the constituent elements shown in the figures is not required, communication based on synchronous detection can be performed, and system and circuit simplification can be achieved. Interference can be suppressed because there is no need to use a plurality of crystal oscillators. It is possible to supply the reference signal to each position, and properly set the respective levels of a processed signal processed on the basis of the reference signal and the reference signal used on a subsequent stage side, while solving the problems of interference, noise, signal distortion, spurious radiation, usable frequencies, and the like.

When a very high frequency as in the millimeter wave band is used for the multiplied reference signal J1, provision can be made by small-sized antennas for transmission and reception. Because the multiplied reference signal J1 is transmitted by radio, wiring between the chips can be reduced.

The carrier signals having an integral submultiple of the frequency of the multiplied reference signal J1 can be used for communication on both the transmitting side and the receiving side, and these carrier signals can be generated in respective communicating devices 2. Thus, communications in a plurality of frequency bands are made possible by making the multiplication numbers of respective transmission and reception pairs different from each other. A plurality of frequencies can be used as carrier signals for respective transmission and reception pairs.

A circuit scale is increased because of the need for the reference signal transmitting device 5 for transmitting the multiplied reference signal J1 having an integral multiple of the frequency of the reference signal Jx and the reference signal receiving device 7 for reproducing the reference signal REFCLK by frequency-dividing the multiplied reference signal J1. However, when the reference signal transmitting device 5 and the reference signal receiving device 7 are applied to signal transmission within a device or signal transmission between devices, the reference signal transmitting device 5 and the reference signal receiving device 7 form a useful mechanism in transmission between multiple points within a device or transmission between multiple points of respective devices.

An integral submultiple of the frequency of the multiplied reference signal J1 can be used for carrier signals (the reference signal Jx and the reference signal REFCLK) on both the transmitting side and the receiving side. However, a ½ frequency divider can easily produce an orthogonal local oscillation signal by using a flip-flop, for example. Thus, communication based on quadrature modulation is easily made possible by providing the frequency relation of a multiple of two.

The frequencies of the modulated signal and the multiplied reference signal J1 are in the relation of an integral multiple. Thus, the radio transmission systems can be configured with antennas of one system even when the modulated signal and the multiplied reference signal J1 are synthesized and then transmitted and received.

When an injection-locked frequency divider (ILD) operating in a narrow input frequency range is used as the frequency divider on the receiving side, the frequency divider can make frequency selection, and therefore communication using a plurality of channels is easily made possible without using a filter for frequency selection.

COMPARISON WITH COMPARATIVE EXAMPLES

First Comparative Example

Figure 6A:
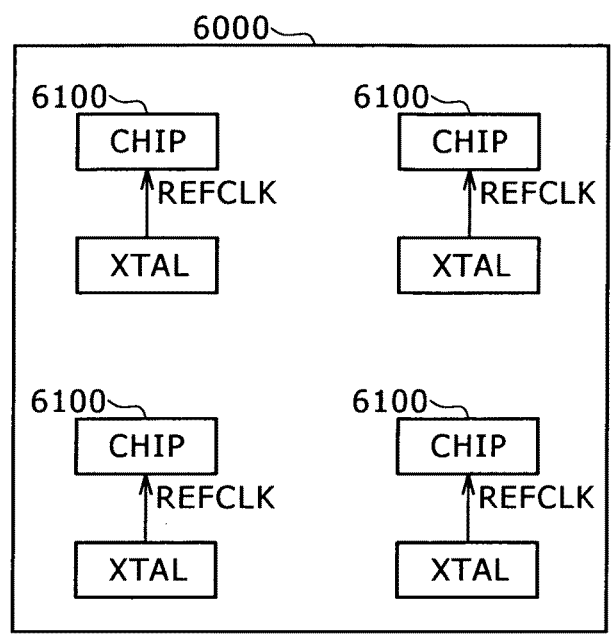
FIGS. 6A and 6B are diagrams of assistance in explaining a first comparative example.
Figure 6B:
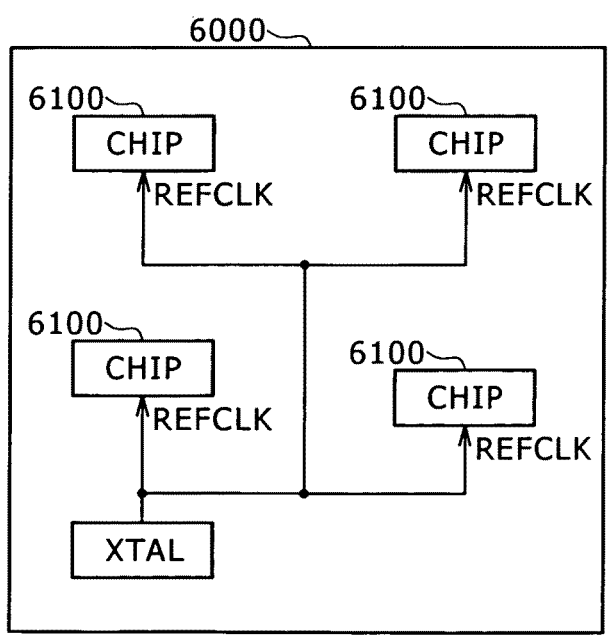

FIGS. 6A and 6B are diagrams of assistance in explaining a first comparative example. In the first comparative example, attention is directed to a "method of providing a reference signal." A plurality of chips 6100 that need the reference signal REFCLK are disposed within an electronic device 6000.

In the first comparative example shown in FIG. 6A, each chip 6100 includes a source reference signal generating section similar to the source reference signal generating section 5100 as a functional part for generating the reference signal REFCLK serving as a clock for a digital circuit or a reference for a synthesizer. The source reference signal generating section for example generates the reference signal REFCLK of a frequency fck by a crystal oscillator (XTAL) or the like.

Even when the frequencies of the reference signals REFCLK are to be made identical to each other in the respective chips 6100, the frequencies of the reference signals REFCLK may not be made completely identical to each other because there are variations in the crystal oscillators at the respective positions. In addition, synchronization is not achieved because each of the crystal oscillators operates independently of the other. In this case, interference between the plurality of reference signals REFCLK occurs, and thus a measure against noise is necessary.

It is also considered that as in the first comparative example shown in FIG. 6B, a crystal oscillator (XTAL) is connected to one of chips 6100, generates a reference signal REFCLK at one position, and supplies the reference signal REFCLK to the other chips 6100. In this case, because the reference signal REFCLK is shared, no problem of a frequency shift or phase synchronization occurs, interference is eliminated, and no measure against noise is necessary. However, wiring for sharing the reference signal REFCLK is necessary, and a problem of spurious radiation occurs when the level of the reference signal REFCLK is increased.

Second Comparative Example

Figure 7A:
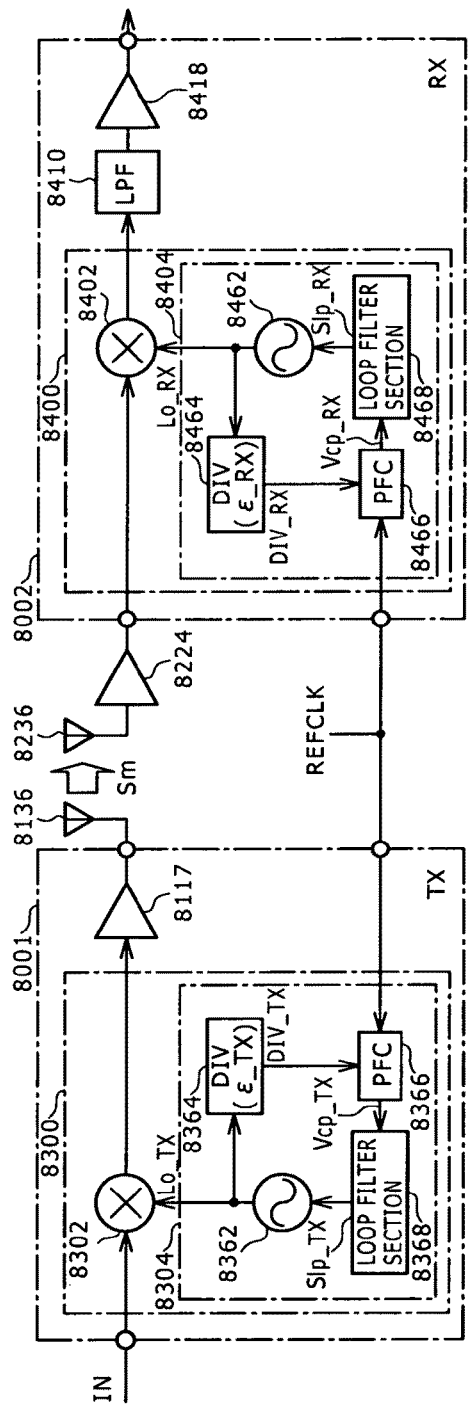
FIGS. 7A and 7B are diagrams of assistance in explaining a second comparative example.
Figure 7B:
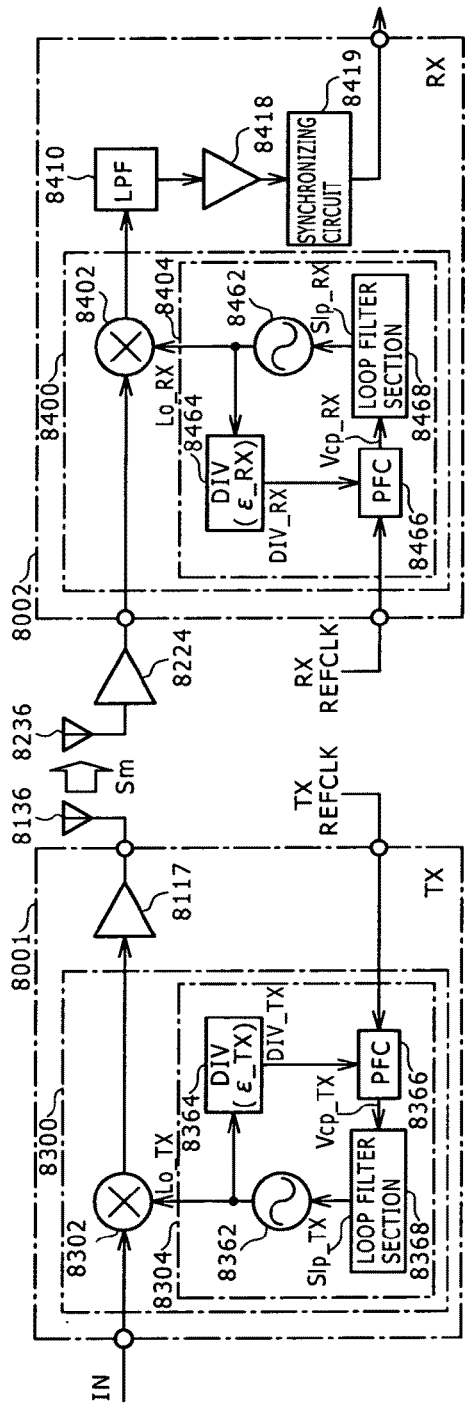

FIGS. 7A and 7B are diagrams of assistance in explaining a second comparative example. In the second comparative example, attention is directed to a "communication system." A basic configuration of the second comparative example is similar to the configuration of the present embodiment shown in FIG. 4.

The second comparative example shown in FIG. 7A is the same as the configuration of the present embodiment in that a carrier signal Lo_TX and a carrier signal Lo_RX are generated on the basis of a common reference signal REFCLK, and the carrier signals can be synchronized with each other (in both frequency and phase). However, wiring for sharing the reference signal REFCLK is necessary, and a problem of spurious radiation occurs when the level of the reference signal REFCLK is increased.

When separate reference signals REFCLK not synchronized with each other are used as in the second comparative example shown in FIG. 7B, a synchronizing circuit 8419 has to be provided in a stage subsequent to (or a stage preceding) a buffer section 8418 to achieve synchronization by a demodulated baseband signal, and thus a circuit scale and power consumption are increased.

Third Comparative Example

Figure 8:
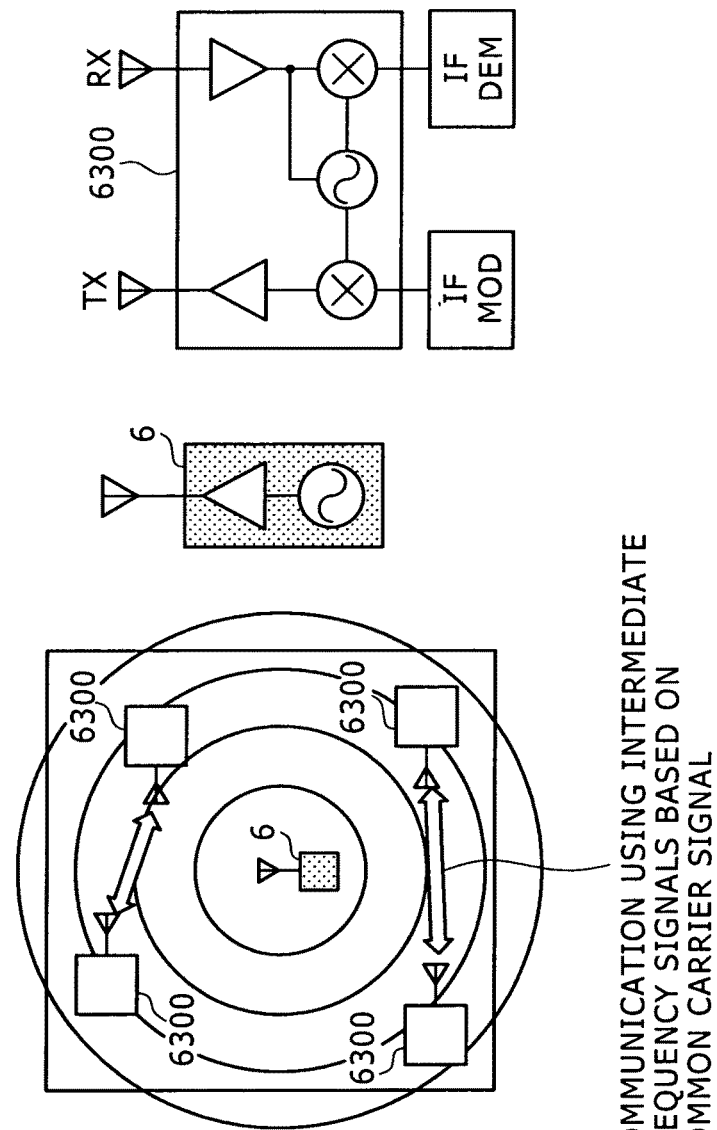
FIG. 8 is a diagram of assistance in explaining a third comparative example.

FIG. 8 is a diagram of assistance in explaining a third comparative example. The third comparative example is also a comparative example in which attention is directed to a "communication system," and corresponds to an example described in Patent Document 1. The third comparative example is similar to the configuration of the present embodiment shown in FIG. 4 in that a carrier signal transmitting device 6 is used. However, in the third comparative example, a carrier signal (local oscillation signal) in the millimeter wave band is transmitted from the carrier signal transmitting device 6 to each communication chip 6300, and each communication chip 6300 performs transmission and reception after raising an input intermediate frequency signal to the millimeter wave band using the common carrier signal received by each communication chip 6300. The third comparative example is a system limited to communication using intermediate frequency signals, and a signal processing circuit for generating and processing the intermediate frequency signals is necessary. Because the carrier signal itself is shared, one kind of frequency can be used as the carrier signal.

Fourth Comparative Example

FIGS. 9A to 9C are diagrams of assistance in explaining a fourth comparative example. The fourth comparative example is also a comparative example in which attention is directed to a "communication system." The fourth comparative example is a system that transmits a local oscillation signal together with a modulated signal, injection-locks the local oscillation signal into a local oscillator on a receiving side, reproduces the local oscillation signal, and performs communication. The fourth comparative example is similar to the configurations of the present embodiments shown in FIG. 4 and FIG. 5 in that the local oscillation signal is reproduced by an injection locking system on the receiving side. However, a difference lies in that whereas the fourth comparative example transmits the carrier signal itself used for modulation together with the modulated signal, the radio transmission system 1 according to the present embodiment transmits the multiplied reference signal J1 having an integral multiple of the frequency of the carrier signal (having the same frequency as the reference signal Jx) used for modulation together with a modulated signal.

In this case, when the local oscillation signal is reproduced by the injection locking system on the receiving side, a lock range changes according to the magnitude of the carrier signal used for injection locking. In order to obtain a wide lock range, the carrier signal has to have a certain high level.

Thus, as shown in FIG. 9B, the local oscillation signal transmitted for injection locking has to have a higher level than a signal component (modulated signal). In the fourth comparative example, in relative terms, the modulated signal that can be transmitted is suppressed to a low level, and a transmission distance is shortened.

On the other hand, in the radio transmission system 1 according to the present embodiment, the respective levels of the modulated signal and the multiplied reference signal J1 can be separately set to be respective optimum levels, and the multiplied reference signal J1 can be used as signal for injection locking. An "optimum" state for the modulated signal may be considered to be a state in which an excellent reception quality is obtained, such for example as a state in which a lowest error rate is obtained. On the other hand, an "optimum" state for the multiplied reference signal J1 may be considered to be a state in which injection locking is easily achieved, for example. As shown in FIG. 9C, as compared with the fourth comparative example, a local oscillation signal component in a modulation signal band can be suppressed to a low level, the level of the modulated signal can be relatively raised, and a transmission distance can be lengthened.

Examples of Application to Electronic Devices

First Example

Figure 10A:
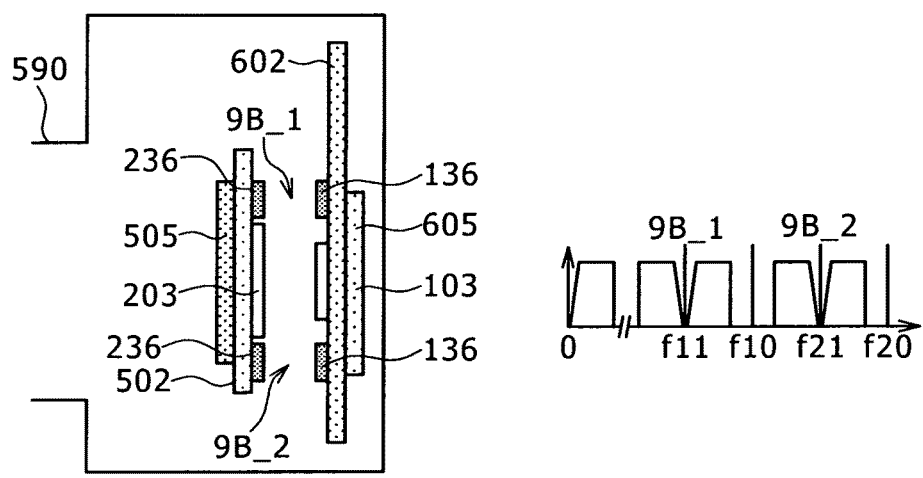
FIGS. 10A and 10B are diagrams of assistance in explaining a first example of an electronic device.
Figure 10B:
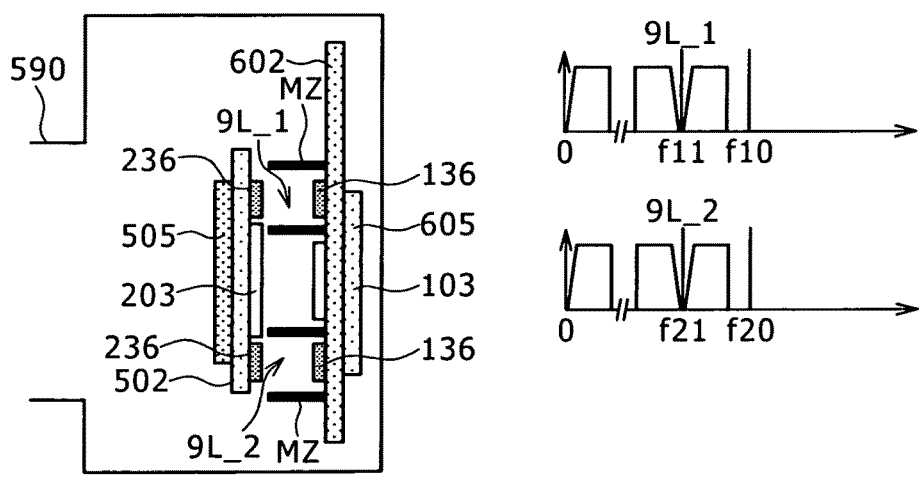

FIGS. 10A and 10B are diagrams of assistance in explaining a first example of an electronic device to which the mechanism according to the present embodiment is applied. The first example is an example of application in a case where signal transmission is performed by radio within a casing of one electronic device. In this example of application, the electronic device is an imaging device including a solid-state imaging device. This kind of imaging device is distributed to a market as a digital camera, a video camera (camcorder), or a camera (Web camera) of a computer device, for example.

The first example has a system configuration in which a first communicating device (corresponding to a communicating device 2) is mounted on a main board having a control circuit, an image processing circuit and the like mounted thereon and a second communicating device (corresponding to a communicating device 2) is mounted on an imaging board (camera board) having the solid-state imaging device mounted thereon. Description in the following will be made supposing that a multiplied reference signal J1 is radio-transmitted in the millimeter wave band, and that data is radio-transmitted in the millimeter wave band.

The imaging board 502 and the main board 602 are disposed within the casing 590 of the imaging device 500. The solid-state imaging device 505 is mounted on the imaging board 502. For example, the solid-state imaging device 505 corresponds to a CCD (Charge Coupled Device) that, together with a driving section therefor (a horizontal driver and a vertical driver), is mounted on the imaging board 502 or a CMOS (Complementary Metal Oxide Semiconductor) sensor.

A semiconductor chip 103 functioning as the first communicating device is mounted on the main board 602, and a semiconductor chip 203 functioning as the second communicating device is mounted on the imaging board 502. Though not shown in FIGS. 10A and 10B, not only the solid-state imaging device 505 but also a peripheral circuit such as an imaging driving section and the like is mounted on the imaging board 502, and an image processing engine, an operating section, various sensors and the like are mounted on the main board 602.

Each of the semiconductor chip 103 and the semiconductor chip 203 incorporates the functions of the reference signal transmitting device 5, and also incorporates the functions of the reference signal receiving device 7. Further, each of the semiconductor chip 103 and the semiconductor chip 203 incorporates functions equivalent to those of the transmitting chip 8001 and the receiving chip 8002. Bidirectional communication can be dealt with by incorporating the functions of both the transmitting chip 8001 and the receiving chip 8002. These points are also true for other examples of application to be described later.

The solid-state imaging device 505 and the imaging driving section correspond to an application functional part of an LSI functional part on the side of the first communicating device. The LSI functional part is connected with a signal generating section on a transmitting side, and further connected with an antenna 236 via a transmission line coupling section. The signal generating section and the transmission line coupling section are housed in the semiconductor chip 203 separate from the solid-state imaging device 505, and mounted on the imaging board 502.

The image processing engine, the operating section, the various sensors and the like correspond to an application functional part of an LSI functional part on the side of the second communicating device, and house an image processing section for processing an imaging signal obtained by the solid-state imaging device 505. The LSI functional part is connected with a signal generating section on a receiving side, and further connected with an antenna 136 via a transmission line coupling section. The signal generating section and the transmission line coupling section are housed in the semiconductor chip 103 separate from the image processing engine, and mounted on the main board 602.

The signal generating section on the transmitting side includes for example a multiplexing processing section, a parallel-serial converting section, a modulating section, a frequency converting section, and an amplifying section. The signal generating section on the receiving side includes for example an amplifying section, a frequency converting section, a demodulating section, a serial-parallel converting section, and a simplification processing section. These points are also true for the other examples of application to be described later.

By performing radio communication between the antenna 136 and the antenna 236, an image signal obtained by the solid-state imaging device 505 is transmitted to the main board 602 via a radio signal transmission line 9 between the antennas. The system may be configured to enable bidirectional communication. In this case, for example, a reference clock and various control signals for controlling the solid-state imaging device 505 are transmitted to the imaging board 502 via the radio signal transmission line 9 between the antennas.

In each of FIG. 10A and FIG. 10B, millimeter wave signal transmission lines 9 of two systems are provided. In each of FIG. 10A and FIG. 10B, one of the millimeter wave signal transmission lines 9 is used for data transmission at a carrier frequency f11 and the transmission of a multiplied reference signal J1a of a frequency f10 corresponding to the carrier frequency f11, and the other is used for data transmission at a carrier frequency f21 and the transmission of a multiplied reference signal J1b of a frequency f20 corresponding to the carrier frequency f21. The frequency f10 is in multiplied relation (also synchronized) with the carrier frequency f11. The frequency f20 is in multiplied relation (also synchronized) with the carrier frequency f21.

In FIG. 10A, a free space transmission line 9B is used as the radio signal transmission line 9, and a system (free space transmission line 9B_1) of the carrier frequency f11 and a system (free space transmission line 9B_2) of the carrier frequency f21 are separated from each other in frequency to such a degree as to prevent interference. In FIG. 10B, a hollow waveguide 9L of a structure whose periphery is surrounded by a shielding material MZ and whose inside is hollow is used as the radio signal transmission line 9, and interference is prevented even when a system (hollow waveguide 9L_1) of the carrier frequency f11 and a system (hollow waveguide 9L_2) of the carrier frequency f21 have a same frequency.

Second Example

Figure 11A:
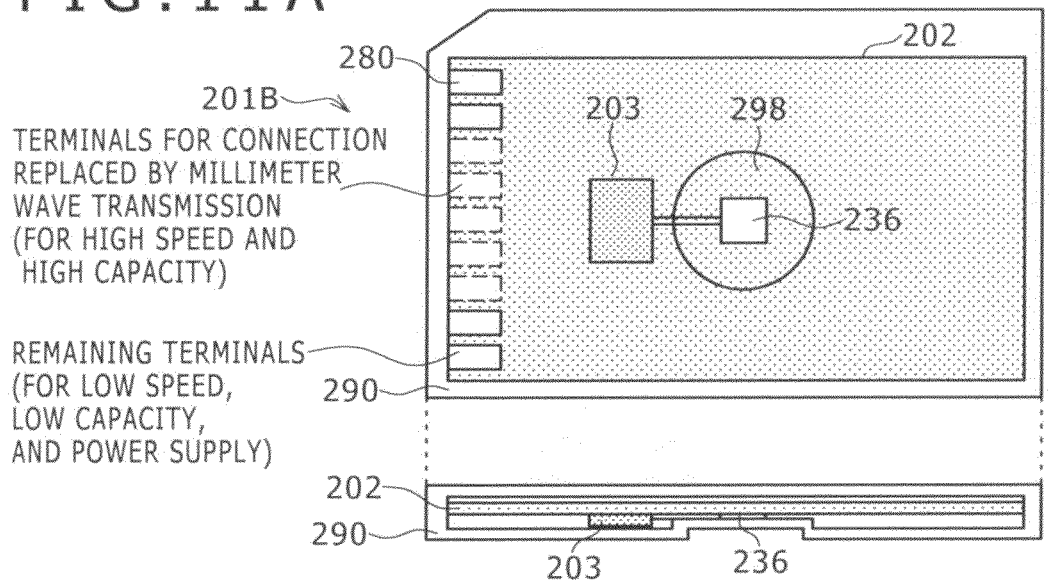
FIGS. 11A to 11C are diagrams of assistance in explaining a second example of an electronic device.
Figure 11B:
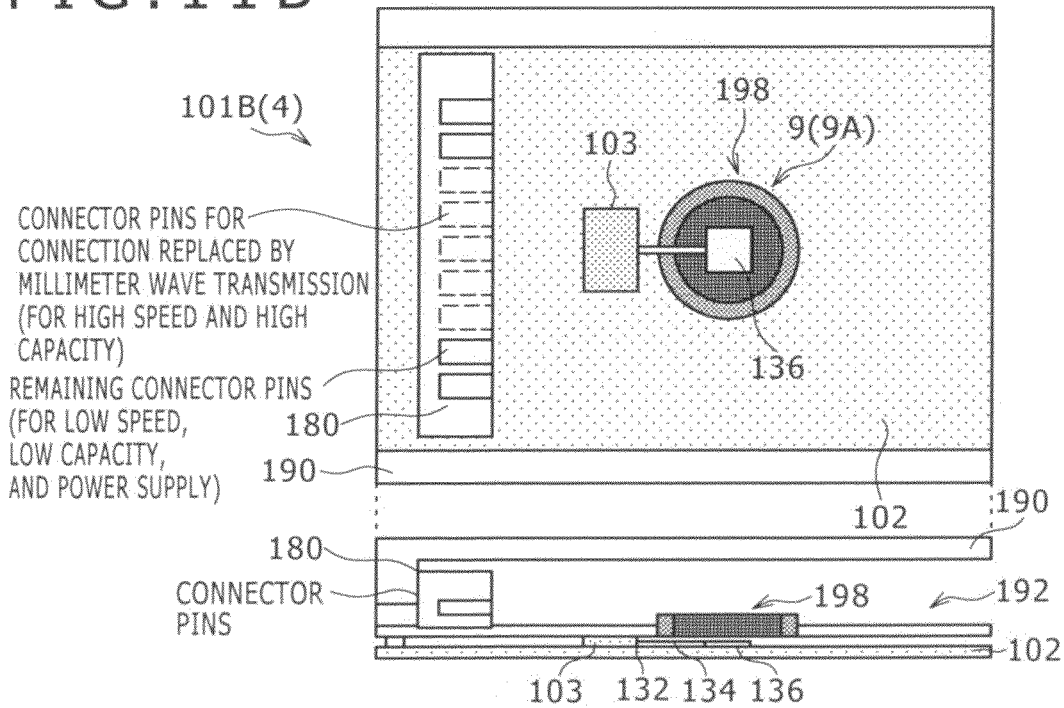
Figure 11C:
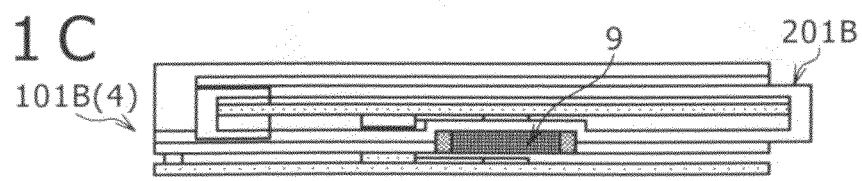

FIGS. 11A to 11C are diagrams of assistance in explaining a second example of an electronic device to which the mechanism according to the present embodiment is applied. The second example is an example of application in a case where signal transmission is performed by radio between a plurality of electronic devices in a state in which the electronic devices are integral with each other. The mechanism according to the present embodiment is applied particularly to signal transmission between two electronic devices when one electronic device is loaded in the other electronic device. Incidentally, description in the following will be made supposing that a multiplied reference signal J1 is radio-transmitted in the millimeter wave band, and that data is radio-transmitted in the millimeter wave band.

There is for example a system in which a card type information processing device typified by a so-called IC card or a memory card including a central processing unit (CPU), a nonvolatile storage device (for example a flash memory) and the like is loadable into (detachable from) an electronic device on a main unit side. The card type information processing device as an example of one (first) electronic device will hereinafter be also referred to as a "card type device." The other (second) electronic device on the main unit, side will hereinafter be also referred to simply as an electronic device.

FIG. 11A shows an example of structure (plane perspective and sectional perspective) of a memory card 201B. FIG. 11B shows an example of structure (plane perspective and sectional perspective) of an electronic device 101B. FIG. 11C shows an example of structure (sectional perspective) when the memory card 201B is inserted in the slot structure 4 (opening 192 in particular) of the electronic device 101B.

The slot structure 4 has a configuration such that the memory card 201B (casing 290 of the memory card 201B) can be inserted into the casing 190 of the electronic device 101B from the opening 192 and removed from the casing 190 of the electronic device 101B, and fixed to the casing 190 of the electronic device 101B. A connector 180 on a receiving side is provided in a position of contact with terminals of the memory card 201B in the slot structure 4. Connector terminals (connector pins) are not necessary for signals to be transmitted by radio.

As shown in FIG. 11A, the casing 290 of the memory card 201B has a cylindrical depression shape configuration 298 (hollow). As shown in FIG. 11B, the casing 190 of the electronic device 101B has a cylindrical projection shape configuration 198 (protrusion). The memory card 201B has a semiconductor chip 203 on one surface of a board 202, and an antenna 236 is formed on one surface of the board 202. The casing 290 has the depression shape configuration 298 in the same surface as the antenna 236. The part of the depression shape configuration 298 is formed by a dielectric resin including a dielectric material allowing radio signal transmission.

A connecting terminal 280 for being connected to the electronic device 101B at a determined position of the casing 290 is disposed at the determined position of the casing 290 at one side of the board 202. The memory card 201B includes, in a part thereof, an existing terminal structure for low-speed and low-capacity signals and for power supply. Terminals for objects to which signal transmission by the millimeter wave can be applied are removed, as indicated by broken lines in FIG. 11A.

As shown in FIG. 11B, the electronic device 101B has a semiconductor chip 103 on a surface on the opening part 192 side of a board 102, and an antenna 136 is formed on one surface of the board 102. The opening part 192 into and from which the memory card 201B is inserted and removed is formed as the slot structure 4 in the casing 190. The projection shape configuration 198 having a millimeter wave confining structure (waveguide structure) is formed in the casing 190 so as to constitute a dielectric transmission line 9A in a part corresponding to the position of the depression shape configuration 298 when the memory card 201B is inserted into the opening 192.

As shown in FIG. 11C, the casing 190 of the slot structure 4 has a mechanical structure such that the projection shape configuration 198 (dielectric transmission line 9A) and the depression shape configuration 298 come into contact with each other in the form of a projection and a depression when the memory card 201B is inserted from the opening part 192 into the casing 190 of the slot structure 4. When the projection and depression structures are fitted to each other, the antenna 136 and the antenna 236 are opposed to each other, and the dielectric transmission line 9A is disposed as the radio signal transmission line 9 between the antenna 136 and the antenna 236. Although the casing 290 of the memory card 201B is interposed between the dielectric transmission line 9A and the antenna 236, the material of the part of the depression shape configuration 298 is a dielectric material, and thus does not produce a significant effect on radio transmission in the millimeter wave band.

Third Example

Figure 12A:
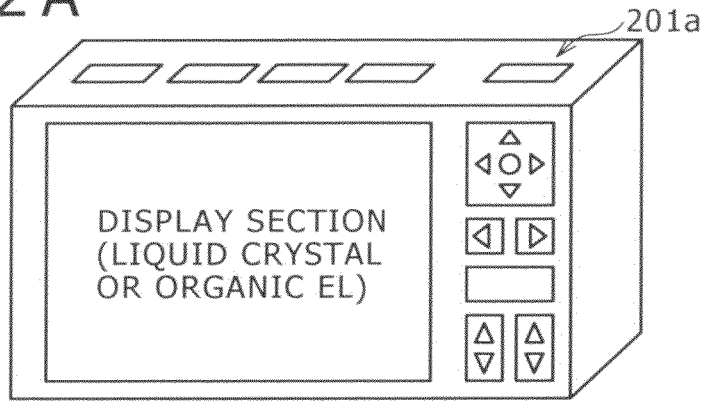
FIGS. 12A to 12C are diagrams of assistance in explaining a third example of an electronic device.
Figure 12B:
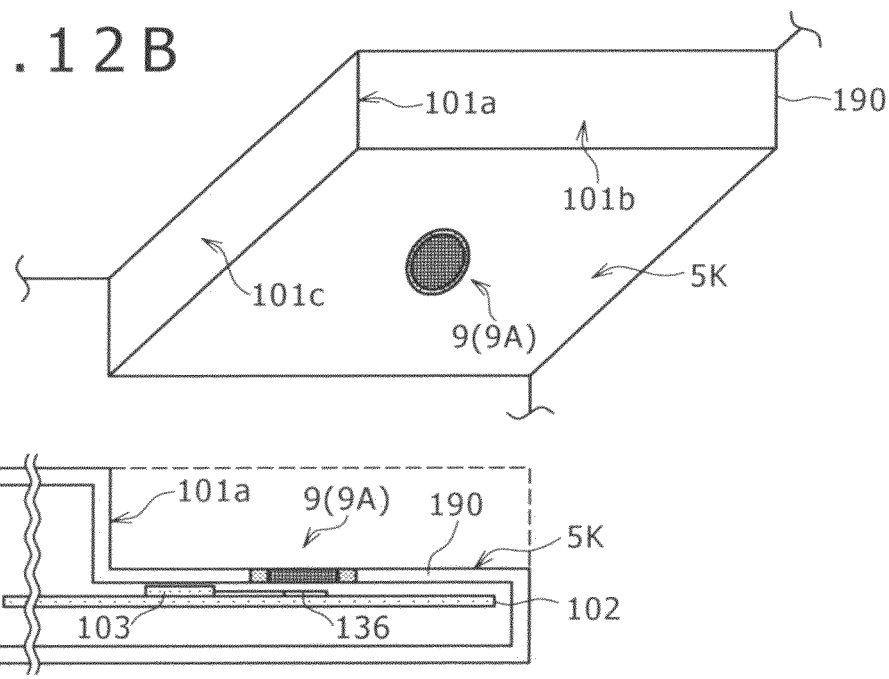
Figure 12C:
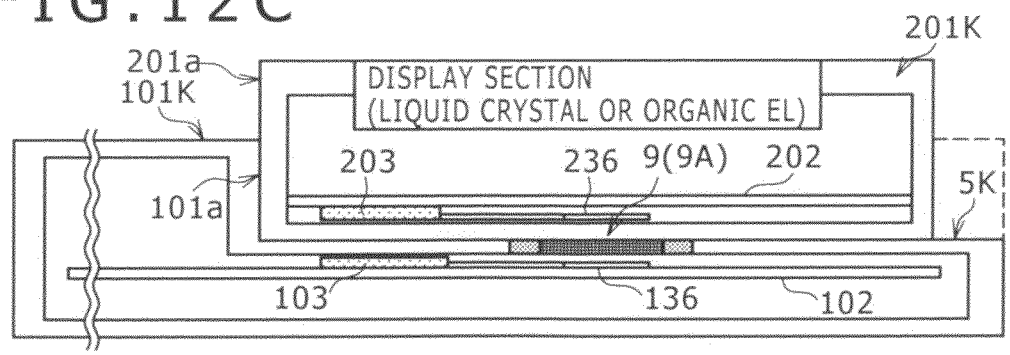

FIGS. 12A to 12C are diagrams of assistance in explaining a third example of an electronic device to which the mechanism according to the present embodiment is applied. A radio transmission system 1 includes a portable type image reproducing device 201K as an example of a first electronic device, and includes an image obtaining device 101K as an example of a second (main unit side) electronic device on which to mount the image reproducing device 201K. The image obtaining device 101K has a mounting base 5K on which to mount the image reproducing device 201K as a part of a casing 190. Incidentally, a slot structure 4 as in the second example may be used in place of the mounting base 5K. The third example is the same as the second example in that signal transmission is made by radio between two electronic devices when one electronic device is mounted in the other electronic device. Description in the following will be made with attention directed to differences from the second example.

The image obtaining device 101K has substantially the shape of a rectangular parallelepiped (box shape), and can no longer be said to be a card type. It suffices for the image obtaining device 101K to obtain moving image data, for example. A digital recording and reproducing device or a terrestrial television receiver, for example, corresponds to the image obtaining device 101K. The image reproducing device 201K includes, as an application functional part, a storage device for storing moving image data transmitted from the side of the image obtaining device 101K and a functional part for reading moving image data from the storage device and reproducing a moving image on a display section (for example a liquid crystal display device or an organic EL display device). It suffices to consider from a structural viewpoint that the memory card 201B is replaced with the image reproducing device 201K and that the electronic device 101B is replaced with the image obtaining device 101K.

As in the second example (FIGS. 11A to 11C), for example, a semiconductor chip 103 is housed under the mounting base 5K within the casing 190, and an antenna 136 is provided at a certain position under the mounting base 5K within the casing 190. A dielectric transmission line 9A is formed by a dielectric material as a radio signal transmission line 9 in a part of the casing 190 which part is opposed to the antenna 136. As in the second example (FIGS. 11A to 11C), for example, a semiconductor chip 203 is housed within the casing 290 of the image reproducing device 201K mounted on the mounting base 5K, and an antenna 236 is provided at a certain position within the casing 290. A radio signal transmission line 9 (dielectric transmission line 9A) is formed by a dielectric material in a part of the casing 290 which part is opposed to the antenna 236. These points are similar to those of the foregoing second example.

The third example adopts a wall surface butting system rather than the concept of a fitting structure. The antenna 136 and the antenna 236 are opposed to each other when the image reproducing device 201K is placed so as to be butted against a corner 101a of the mounting base 5K. Thus effects of positional displacement can be surely eliminated. Such a constitution makes it possible to perform alignment for radio signal transmission of the image reproducing device 201K at the time of mounting (loading) the image reproducing device 201K on the mounting base 5K. Although the casing 190 and the casing 290 are interposed between the antenna 136 and the antenna 236, the casing 190 and the casing 290 are a dielectric material, and thus do not greatly affect radio transmission in the millimeter wave band.

Examples of Application to Radio Transmission Systems

Other examples of application of the radio transmission system 1 according to the present embodiment will be described in the following. Description in the following will be made of a case where the reference signal transmitting device 5A in the first example is used as a reference signal transmitting device 5. However, the reference signal transmitting device 5B in the second example may be used as the reference signal transmitting device 5.

First Example of Application

Figure 13:
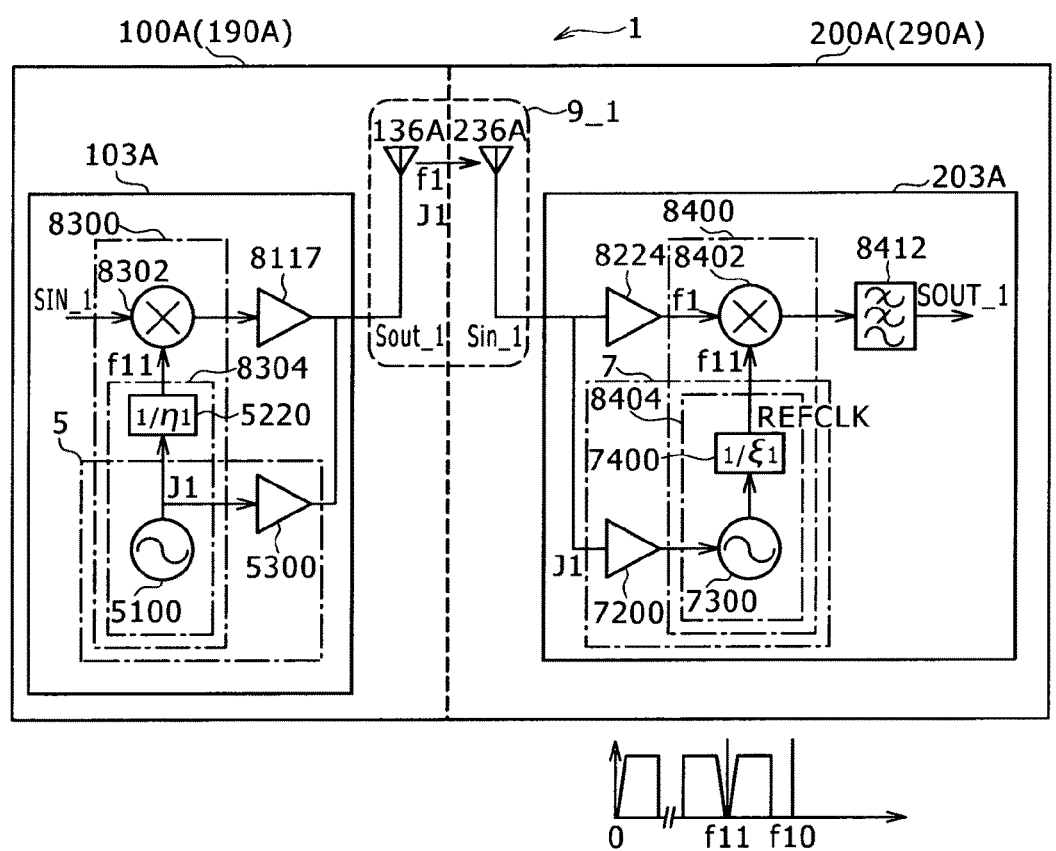
FIG. 13 is a diagram of assistance in explaining a first example of application of the radio transmission system.

FIG. 13 is a diagram of assistance in explaining a first example of application of the radio transmission system 1 according to the present embodiment. In the first example of application, signal transmission is made in the millimeter wave band between a semiconductor chip 103A and a semiconductor chip 203A formed by a CMOS process within a casing of one electronic device or between a plurality of electric devices.

The external shapes of a casing 190A on the side of a first communicating device 100A and a casing 290A on the side of a second communicating device 200A are not limited to a cube (rectangular parallelepiped), but may be a sphere, a cylinder, a semicylinder, or an elliptic cylinder. In a case of signal transmission within one casing, it suffices to consider that the semiconductor chip 103A and the semiconductor chip 203A are mounted on a same board, for example. Alternatively, it suffices to consider that the casing 190A on the side of the first communicating device 100A and the casing 290A on the side of the second communicating device 200A are integral with each other. In a case of signal transmission between electronic devices in a state in which the electronic device including the first communicating device 100A is mounted on the electronic device including the second communicating device 200A, it suffices to consider that the casing 190A on the side of the first communicating device 100A and the casing 290A on the side of the second communicating device 200A are in contact with each other at the part of a dotted line in FIG. 13.

The casings 190A and 290A for example correspond to the exterior (external) case of a digital recording and reproducing device, a terrestrial television receiver, a camera, a hard disk device, a game machine, a computer, a radio communicating device or the like.

For example, in a radio transmission system 1, to transmit a signal desired to have a high-speed characteristic and a high-volume characteristic such as movie video, computer images and the like, the signal is converted into a transmission signal Sout_1 in the millimeter wave band whose carrier frequency f11 is 30 GHz to 300 GHz, and the transmission signal Sout_1 is transmitted through a radio signal transmission line 9_1. The reference signal transmission system 3 according to the present embodiment is applied, and a multiplied reference signal J1 in the millimeter wave band whose frequency f10 is 30 GHz to 300 GHz is also transmitted through the radio signal transmission line 9_1. Suppose that the frequencies f10 and f11 are separated from each other to such a degree that the multiplied reference signal J1 and the modulated signal Sout do not interfere with each other.

The radio signal transmission line 9_1 is formed of a free space inside the casings 190A and 290A, a dielectric transmission line constructed inside the casings 190A and 290A, and a waveguide. The waveguide includes a slot line and/or a microstrip line. The radio signal transmission line 9_1 may be any transmission line as long as the radio signal transmission line 9_1 can transmit the multiplied reference signal J1 and the transmission signal Sout_1 in the millimeter wave band. A dielectric material itself filled inside the casings 190A and 290A also forms the radio signal transmission line 9_1.

Because millimeter waves can be shielded easily, and do not easily leak to the outside, carrier signals of the carrier frequencies f10 and f11 with low stability can be used. This also leads to an increase in degree of freedom of design of a propagation channel between the semiconductor chips 103 and 203. For example, when a sealing material (package) structure for sealing the semiconductor chips 103 and 203 and the propagation channel are designed together using a dielectric material, more reliable and excellent radio transmission of the multiplied reference signal and data can be made as compared with radio signal transmission in a free space.

For example, a free space transmission line may be formed between antennas 136A and 236A by making the inside of the casings 190A and 290A a free space, or the whole of the inside of the casings 190A and 290A may be filled with a dielectric material such as a resin member or the like. In these cases, in order to prevent the multiplied reference signal J1 and the transmission signal Sout_1 in the millimeter wave band from leaking to the outside, it is desirable that the casings 190A and 290A be for example a shielding case having six external surfaces surrounded by a metallic sheet as well as a case whose inside is coated with a resin member. In addition, the casings 190A and 290A may be a case having six external surfaces surrounded by a resin member as well as a case whose inside is shielded with a metallic member. In any case, transmission amplitude tends to be made larger in a case where the injection locking system is applied to the reproduction of the multiplied reference signal J3 than in a case where the injection locking system is not applied to the reproduction of the multiplied reference signal J3. Thus, a shielding measure is desirably taken into consideration of this point.

Preferably, a millimeter wave confining structure (waveguide structure) having a structure that transmits a radio signal in the millimeter wave band while confining the radio signal in a transmission line is made by forming a dielectric transmission line, a hollow waveguide, a waveguide structure or the like between the antennas 136A and 236A, while the inside of the casings 190A and 290A is made to be a free space. The millimeter wave confining structure enables a signal in the millimeter wave band to be reliably transmitted between the antennas 136A and 236A without being affected by reflection in the casings 190A and 290A. In addition, because the radio signal (transmission signal Sout_1) emitted from the antenna 136A can be transmitted to the antenna 236A side in a state of being confined in the radio signal transmission line 9_1, a waste can be reduced (eliminated), and thus transmission power can be reduced. Even in a case where the injection locking system is applied to the reproduction of the multiplied reference signal J3, the transmission power can be made very low, and therefore electromagnetic interference (EMI) is not caused to the outside. Thus, the metallic shielding structure of the casings 190A and 290A may be omitted.

One of the semiconductor chip 103 and the semiconductor chip 203 (semiconductor chip 103 in FIG. 13) incorporates the functional parts of the reference signal transmitting device 5A in the first example, and the other (semiconductor chip 203 in FIG. 13) incorporates the functional parts of the reference signal receiving device 7. The semiconductor chip 103 includes a modulating functional part 8300 (a frequency mixing section 8302 and a transmitting side local oscillating section 8304), an amplifying section 8117, and the functional parts of the reference signal transmitting device 5A. The amplifying section 8117 is connected to the antenna 136A forming a part of a transmission line coupling section. The semiconductor chip 103 converts (modulates) a transmission object signal SIN_1 into a radio signal and emits a transmission signal Sout_1 from the antenna 136A, and sends the multiplied reference signal J1 output from the reference signal transmitting device 5A from the same antenna 136A.

The semiconductor chip 203 includes an amplifying section 8224, a demodulating functional part 8400 (a frequency mixing section 8402 and a receiving side local oscillating section 8404), a low-pass filter 8412, and the functional parts of the reference signal receiving device 7. The amplifying section 8224 is connected to the antenna 236A forming a part of a transmission line coupling section. The semiconductor chip 203 demodulates a transmission object signal SOUT_1 (corresponding to SIN_1) from a received signal Sin_1 (corresponding to Sout_1) received by the antenna 236A. The semiconductor chip 203 receives the multiplied reference signal J1 from the reference signal transmitting device 5A of the semiconductor chip 103, reproduces a reference signal REFCLK, and supplies the reference signal REFCLK as a carrier signal for reproduction to the frequency mixing circuit 8402.

Second Example of Application

Figure 14:
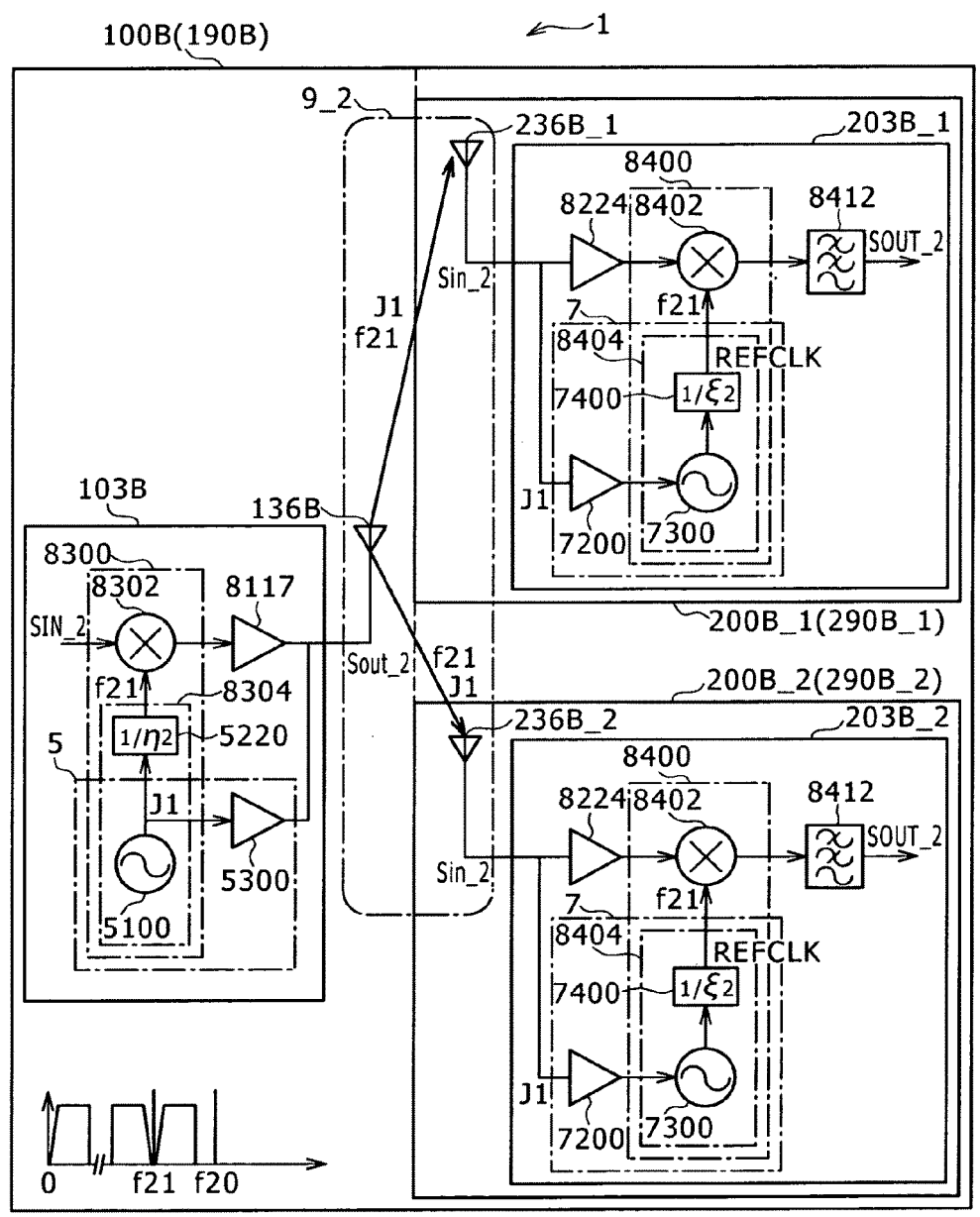
FIG. 14 is a diagram of assistance in explaining a second example of application of the radio transmission system.

FIG. 14 is a diagram of assistance in explaining a second example of application of the radio transmission system 1 according to the present embodiment. In the second example of application, data and a reference signal are transmitted by radio in the millimeter wave band between three semiconductor chips 103B, 203B1, and 203B_2 formed by a CMOS process within a casing of one electronic device or between a plurality of electric devices.

The reference signal transmission system 3 according to the present embodiment is applied, and a multiplied reference signal J1 in the millimeter wave band whose frequency f10 is 30 GHz to 300 GHz is also transmitted through a radio signal transmission line 9_2. The semiconductor chip 103B incorporates the functional parts of the reference signal transmitting device 5A, and the semiconductor chips 203B_1 and 203B_2 incorporate the functional parts of the reference signal receiving device 7.

A difference from the first example of application lies in that signal transmission is made on a one-to-two basis. Typically, broadcast (simultaneous) communication is performed from one semiconductor chip 103B on a transmitting side to two semiconductor chips 203B_1 and 203B_2 on a receiving side. While FIG. 14 shows two semiconductor chips on the receiving side, there may be three or more semiconductor chips. Incidentally, a carrier frequency f21 being used is in the millimeter wave band of 30 GHz to 300 GHz. It is desirable to set a frequency relation such that the frequency f20 of the multiplied reference signal J1 is also in the millimeter wave band of 30 GHz to 300 GHz.

In the second example of application, broadcast communication is achieved by the radio signal transmission line 9_2 forming a one-to-two transmission channel between the semiconductor chip 103B on the transmitting side and the semiconductor chips 203B_1 and 203B_2 on the receiving side. At this time, in order to synchronize carrier signals necessary for modulation and demodulation processing, the multiplied reference signal J1 is transmitted from the reference signal transmitting device 5A to the semiconductor chips 203B_1 and 203B_2 via the radio signal transmission line 9_2. The reference signal receiving device 7 at each position reproduces a reference signal REFCLK, and generates a carrier signal on the basis of the reference signal REFCLK.

Third Example of Application

Figure 15:
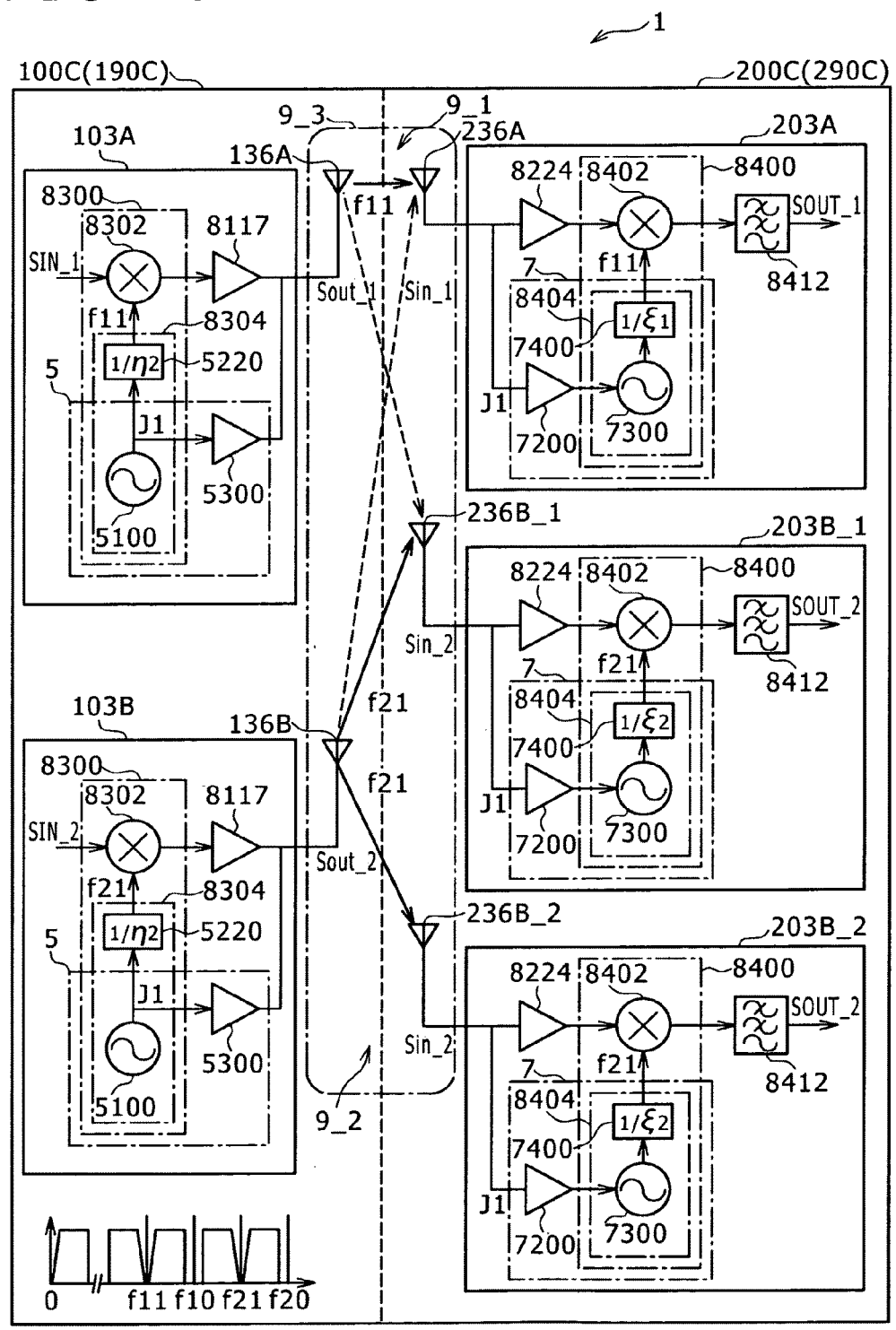
FIG. 15 is a diagram of assistance in explaining a third example of application of the radio transmission system.
Figure 16:
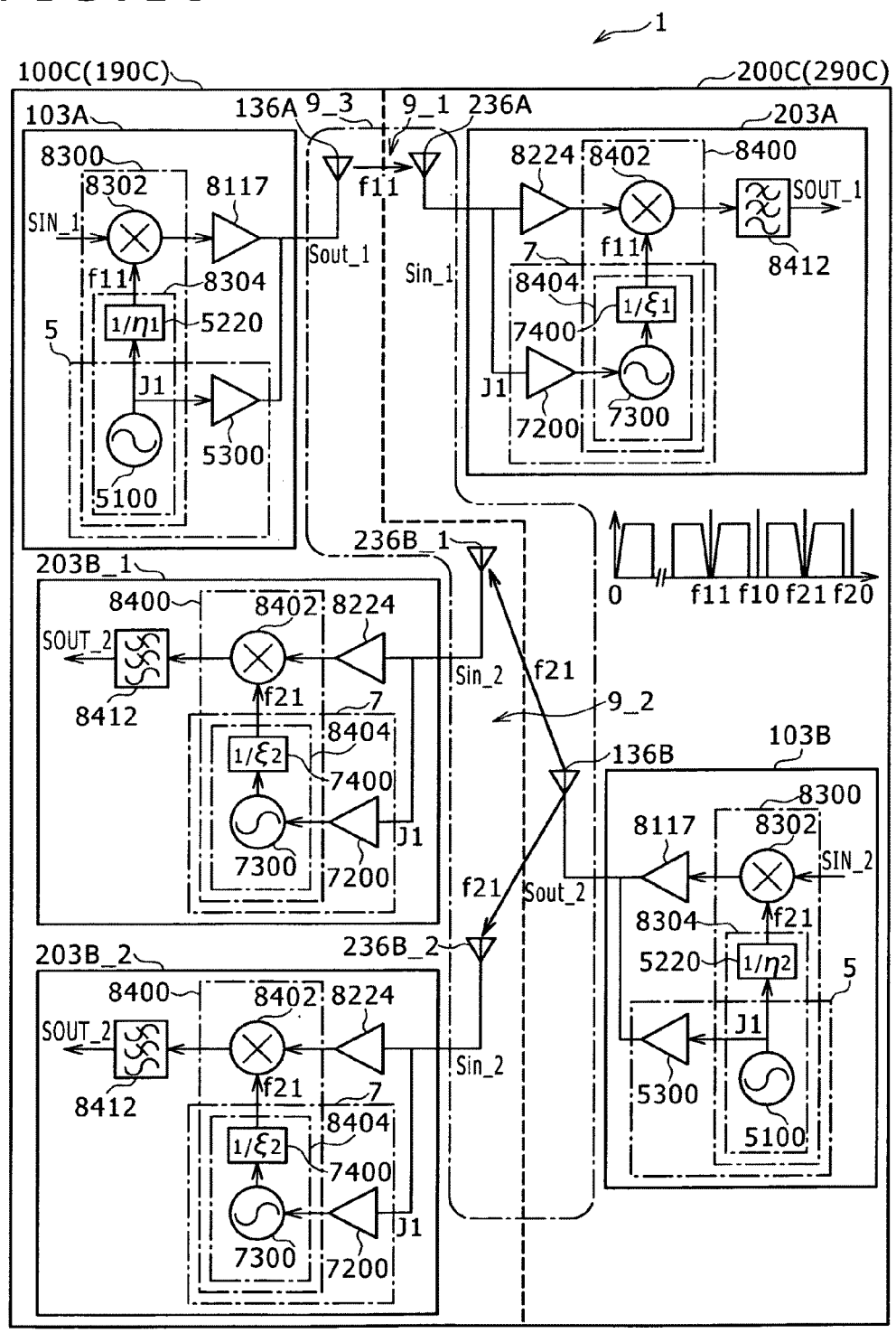
FIG. 16 is a diagram of assistance in explaining the third example of application of the radio transmission system.
Figure 17:
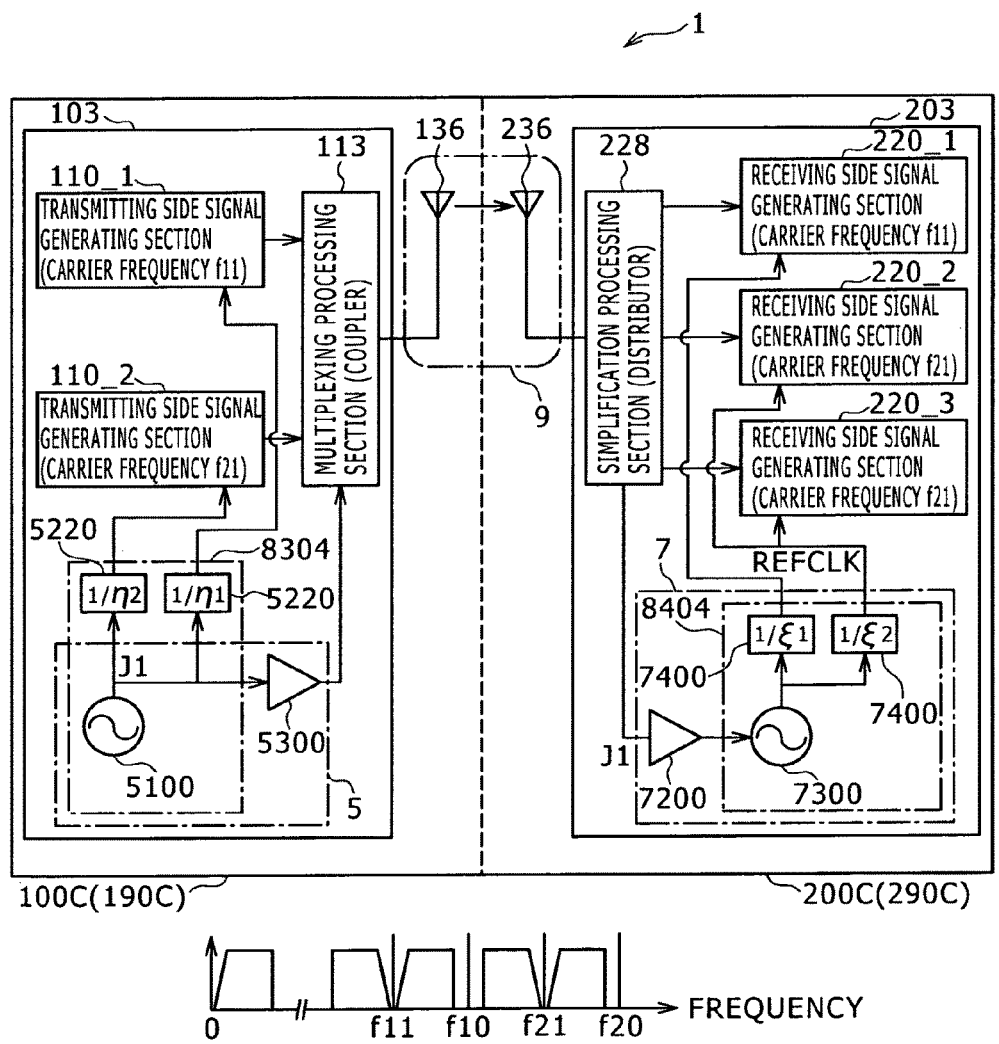
FIG. 17 is a diagram of assistance in explaining the third example of application of the radio transmission system.

FIGS. 15 to 17 are diagrams of assistance in explaining a third example of application of the radio transmission system 1 according to the present embodiment. The third example of application has a configuration in which N (N is a positive integer of two or more) transmitting sections are arranged on a transmitting side, M (M is a positive integer of two or more) receiving sections are arranged on a receiving side, and sets of the transmitting sections and the receiving sections make transmission using respective separate carrier frequencies. That is, frequency division multiplex transmission is made which transmits different signals using a plurality of carrier frequencies. Description in the following will be made of communications of two systems using carrier frequencies f11 and f21.

The third example of application shown in FIG. 15 and FIG. 16 is an example in which each of the transmitting side and the receiving side uses separate antennas, and in which a radio transmission system 1 is constructed by combining the configuration of the foregoing first example of application and the configuration of the foregoing second example of application. The third example of application is a form in which each semiconductor chip can be selected for either of the transmitting side and the receiving side and in which there is basically no limitation on the arrangement position of each semiconductor chip. On the other hand, the third example of application shown in FIG. 17 is a case in which each of a transmitting side and a receiving side uses a common antenna.

In the third example of application shown in FIGS. 15 and 16, the carrier frequency f11 used by a part employing the configuration of the first example of application is in the millimeter wave band of 30 GHz to 300 GHz, and the carrier frequency f21 used by a part employing the configuration of the second example of application is also in the millimeter wave band of 30 GHz to 300 GHz. It is desirable to set a frequency relation such that the frequencies f10 and f20 of a multiplied reference signal J1 are also in the millimeter wave band of 30 GHz to 300 GHz. Suppose that the carrier frequencies f11 and f21 are separated from each other to such a degree that modulating signals do not interfere with each other. Further, suppose that the frequencies f10, f20, f11, and f21 are separated from each other to such a degree that the multiplied reference signal J1 and a modulated signal Sout do not interfere with each other.

In the third example of application shown in FIGS. 15 and 16, the antennas for transmission and reception are coupled to each other by a single radio signal transmission line 9_3. Functionally, a first communication channel is formed by a radio signal transmission line 9_1 for the part employing the configuration of the first example of application, and a second communication channel is formed by a radio signal transmission line 9_2 for the part employing the configuration of the second example of application. Because of the single radio signal transmission line 9_3, for example radio waves of the carrier frequency f11 of the radio signal transmission line 9_1 can be transmitted to the side of the radio signal transmission line 9_2, and radio waves of the carrier frequency f21 of the radio signal transmission line 9_2 can be transmitted to the side of the radio signal transmission line 9_1.

In the part employing the configuration of the first example of application, signal transmission is performed in the millimeter wave band between semiconductor chips 103 and 203 via the radio signal transmission line 9_1 using the carrier frequency f11. In the part employing the configuration of the second example of application, broadcast communication is performed in the millimeter wave band between a semiconductor chip 103B and semiconductor chips 203B_1 and 203B_2 via the radio signal transmission line 9_2 using the carrier frequency f21 (≠ f11). That is, a one-to-one transmission system and a one-to-two transmission system are mixed with each other in the third example of application.

In this case, the reference signal transmitting device 5A is incorporated in the semiconductor chip 103 on the transmitting side, and the reference signal receiving device 7 is incorporated in the semiconductor chip 203 on the receiving side. Thus, by setting the different carrier frequencies f11 and f21 for the different communication channels, respective signal transmissions on the communication channels are achieved without being affected by interference.

For example, as indicated by a dotted line in FIG. 15, suppose that while the semiconductor chip 203B_1 is receiving a transmission signal Sout_2 (=received signal Sin_2) of the carrier frequency f21 and performing synchronous detection, a transmission signal Sout_1 of the carrier frequency f11 also arrives at the semiconductor chip 203B_1. Even when the semiconductor chip 203B_1 receives the modulated signal of the carrier frequency f11 while performing synchronous detection at the carrier frequency f21, the semiconductor chip 203B_1 is not affected by interference of the component of the carrier frequency f11.

In addition, as indicated by a dotted line in FIG. 15, suppose that while the semiconductor chip 203A is receiving the transmission signal Sout_1 (=received signal Sin_1) of the carrier frequency f11 and performing synchronous detection, the transmission signal Sout_2 of the carrier frequency f21 also arrives at the semiconductor chip 203A. Even when the semiconductor chip 203A receives the modulated signal of the carrier frequency f21 while performing synchronous detection at the carrier frequency f11, the semiconductor chip 203A is not affected by interference of the component of the carrier frequency f21.

The third example of application shown in FIG. 17 is a form in which N transmitting side signal generating sections 110 are housed in one (transmitting side) semiconductor chip 103, M receiving side signal generating sections 220 are housed in another (receiving side) semiconductor chip 203, and frequency division multiplexing is applied to enable simultaneous signal transmission in a same direction from each transmitting side signal generating section 110 to each receiving side signal generating section 220.

For example, a first and a second transmitting side signal generating section 110_1 and 110_2 are arranged in a first communicating device 100C, and a first, a second, and a third receiving side signal generating section 220_1, 220_2, and 220_3 are arranged in a second communicating device 200C. Suppose that a set of the first transmitting side signal generating section 110_1 and the first receiving side signal generating section 220_1 uses a first carrier frequency f11, and that a set of the second transmitting side signal generating section 110_2 and the second and third receiving side signal generating sections 220_2 and 220_3 uses a second carrier frequency f21 (≠ f11).

Radio signals of the carrier frequencies f11 and f21 which radio signals are generated in the respective transmitting side signal generating sections 110_1 and 110_2 are integrated into one system by a coupler as an example of a multiplexing processing section 113, and then transmitted in a radio signal transmission line 9 via an antenna 136 of a transmission line coupling section. An antenna 236 on the receiving side receives the radio signal transmitted through the radio signal transmission line 9, separates the radio signal into radio signals for three systems by a distributor as an example of a simplification processing section 228, and supplies the radio signals to the respective receiving side signal generating sections 220_1, 220_2, and 220_3.

As with the third example of application shown in FIGS. 15 and 16, the third example of application shown in FIG. 17 can achieve frequency division multiplex transmission, which transmits different signals in a same direction using the two carrier frequencies f11 and f21, without causing any interference problem.

Fourth Example of Application

Figure 18:
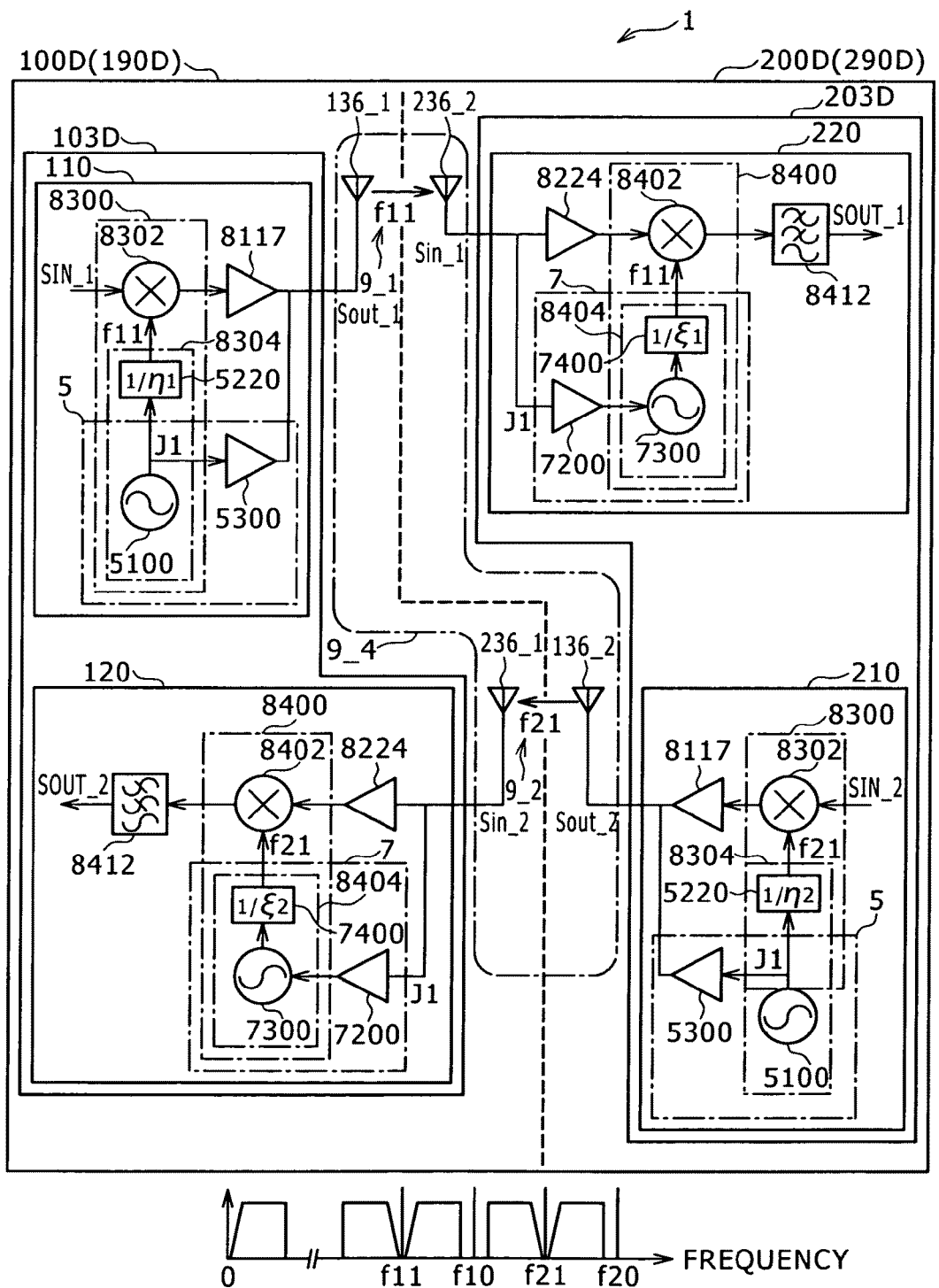
FIG. 18 is a diagram of assistance in explaining a fourth example of application of the radio transmission system.
Figure 19:
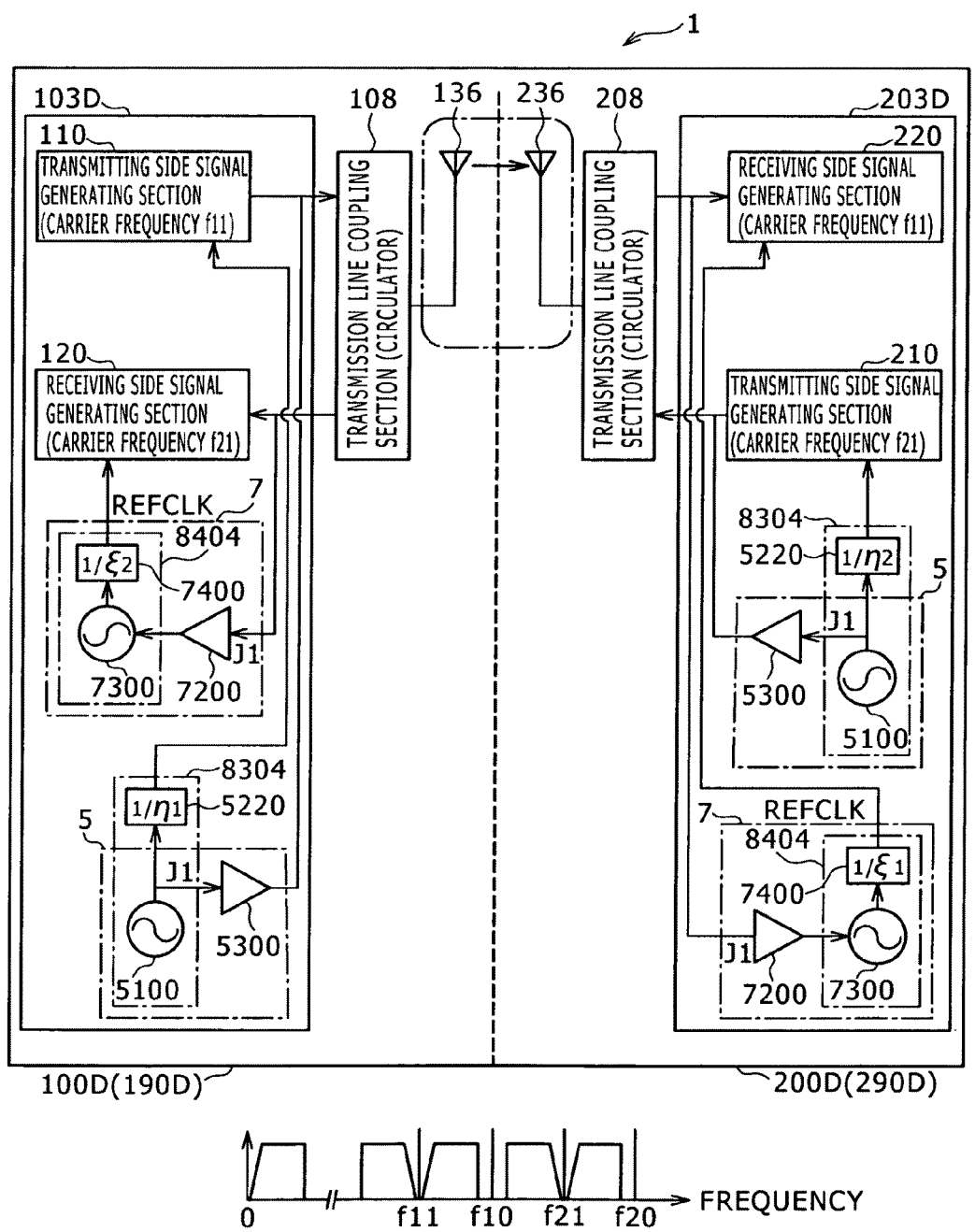
FIG. 19 is a diagram of assistance in explaining the fourth example of application of the radio transmission system.

FIG. 18 and FIG. 19 are diagrams of assistance in explaining a fourth example of application of the radio transmission system 1 according to the present embodiment. The fourth example of application has a configuration in which an equal number of transmitting sections and receiving sections are disposed within each of a pair of semiconductor chips for bidirectional communication, and in which sets of the transmitting sections and the receiving sections use respective separate carrier frequencies to perform full-duplex bidirectional communication. Description in the following will be made of communications of two systems in which a carrier frequency f11 is used for one communication and a carrier frequency f21 is used for a communication in an opposite direction from that of the one communication to simplify the description.

The carrier frequency f11 is in the millimeter wave band of 30 GHz to 300 GHz. The carrier frequency f21 is also in the millimeter wave band of 30 GHz to 300 GHz. However, suppose that the carrier frequencies f11 and f21 are separated from each other to such a degree that modulating signals do not interfere with each other. Further, the reference signal transmission system 3 according to the present embodiment is applied, and multiplied reference signals J1 of frequencies f10 and f20 are transmitted through a radio signal transmission line 9_4. It is desirable to set a frequency relation such that the frequencies f10 and f20 of the multiplied reference signals J1 are also in the millimeter wave band of 30 GHz to 300 GHz. The frequencies f10, f20, f11, and f21 are separated from each other to such a degree that the multiplied reference signal J1 and a modulated signal Sout do not interfere with each other.

In this case, the reference signal transmitting device 5A is incorporated in semiconductor chips 103 and 203, and the reference signal receiving device 7 is also incorporated in the semiconductor chips 103 and 203. Thus, by setting the different carrier frequencies f11 and f21 for different communication channels, respective signal transmissions on the communication channels are achieved without being affected by interference.

In the fourth example of application shown in FIG. 18, each of a transmitting side and a receiving side uses a separate antenna. On the other hand, in the fourth example of application shown in FIG. 19, each of the semiconductor chips for bidirectional communication uses a common antenna.

In the fourth example of application shown in FIG. 18, antennas for transmission and reception of two systems are coupled to each other by a single radio signal transmission line 9_4. Functionally, a first communication channel is formed by a radio signal transmission line 9_1, and a second communication channel for performing transmission in an opposite direction from that of the first communication channel is formed by a radio signal transmission line 9_2. Because of the single radio signal transmission line 9_4, for example radio waves of the carrier frequency f11 of the radio signal transmission line 9_1 can be transmitted to the side of the radio signal transmission line 9_2, and radio waves of the carrier frequency f21 of the radio signal transmission line 9_2 can be transmitted to the side of the radio signal transmission line 9_1.

For example, a semiconductor chip 103D of a first communicating device 100D is provided with a transmitting side signal generating section 110 and a receiving side signal generating section 120, and a semiconductor chip 203D of a second communicating device 200D is provided with a transmitting side signal generating section 210 and a receiving side signal generating section 220.

The transmitting side signal generating section 110 includes a modulating functional part 8300 (a frequency mixing section 8302 and a transmitting side local oscillating section 8304) and an amplifying section 8117. The amplifying section 8117 is connected to an antenna 136_1 forming a part of a transmission line coupling section. The semiconductor chip 103D (transmitting side signal generating section 110) converts (modulates) a transmission object signal SIN_1 into a radio signal, and emits a transmission signal Sout_1 from the antenna 136_1.

The receiving side signal generating section 220 includes an amplifying section 8224, a demodulating functional part 8400 (a frequency mixing circuit 8402 and a receiving side local oscillating section 8404), and a low-pass filter 8412. The amplifying section 8224 is connected to an antenna 236_2 forming a part of a transmission line coupling section. The semiconductor chip 203D (receiving side signal generating section 220) reconstructs (demodulates) a transmission object signal SOUT_1 (corresponding to SIN_1) from a received signal Sin_1 (corresponding to Sout_1) received by the antenna 236_2. That is, the semiconductor chips 103D and 203D make signal transmission in the millimeter wave band via the radio signal transmission line 9_4 (the radio signal transmission line 9_1 of the radio signal transmission line 9_4) between the antennas 136_1 and 236_2.

The transmitting side signal generating section 210 includes a modulating functional part 8300 (a frequency mixing section 8302 and a transmitting side local oscillating section 8304) and an amplifying section 8117. The amplifying section 8117 is connected to an antenna 136_2 forming a part of a transmission line coupling section. The semiconductor chip 203D (transmitting side signal generating section 210) converts (modulates) a transmission object signal SIN_2 into a radio signal, and emits a transmission signal Sout_2 from the antenna 136_2.

The receiving side signal generating section 120 includes an amplifying section 8224, a demodulating functional part 8400 (a frequency mixing circuit 8402 and a receiving side local oscillating section 8404), and a low-pass filter 8412. The amplifying section 8224 is connected to an antenna 236_1 forming a part of a transmission line coupling section. The semiconductor chip 103D (receiving side signal generating section 120) reconstructs (demodulates) a transmission object signal SOUT_2 (corresponding to SIN_2) from a received signal Sin_2 (corresponding to Sout_2) received by the antenna 236_1. That is, the semiconductor chips 103D and 203D make signal transmission in the millimeter wave band via the radio signal transmission line 9_4 (the radio signal transmission line 9_2 of the radio signal transmission line 9_4) between the antennas 136_2 and 236_1.

In order to enable full-duplex bidirectional transmission, separate frequencies are assigned as reference carrier signals to different sets of transmitting sections and receiving sections for making signal transmission. The set of the transmitting side signal generating section 110 and the receiving side signal generating section 220 uses the first carrier frequency f11. The set of the transmitting side signal generating section 210 and the receiving side signal generating section 120 uses the second carrier frequency f21 ($\neq$ f11).

A multiplied reference signal J1 is received from the reference signal transmitting device 5A, and a reference signal REFCLK is generated and used as a carrier signal for demodulation. However, by setting the different carrier frequencies f11 and f21 for different communication channels, full-duplex bidirectional transmission is achieved without being affected by interference.

<Phase Uncertainty and Measures against Phase Uncertainty>

Figure 20:
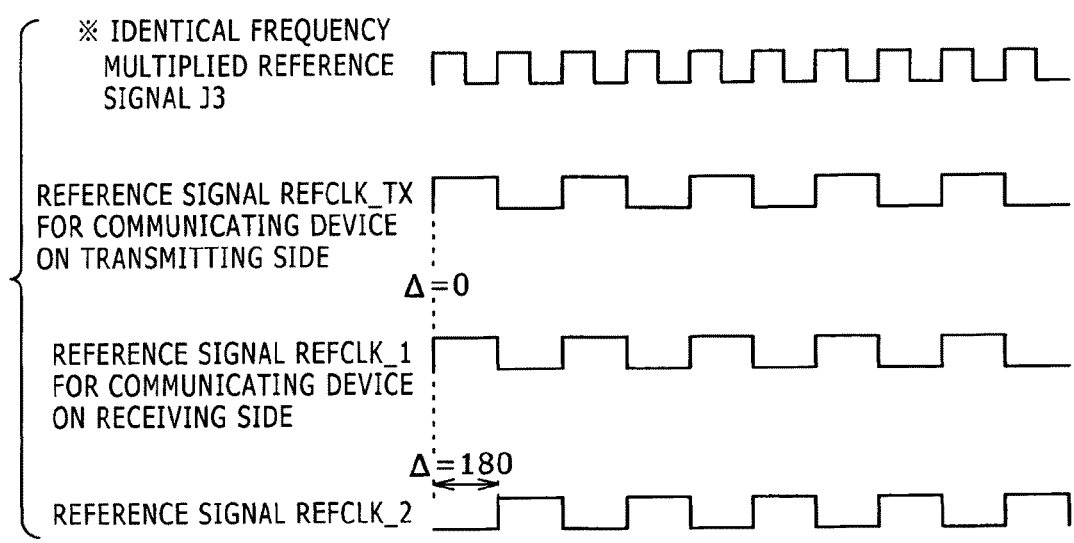
FIG. 20 is a diagram of assistance in explaining phase uncertainty.
Figure 21:
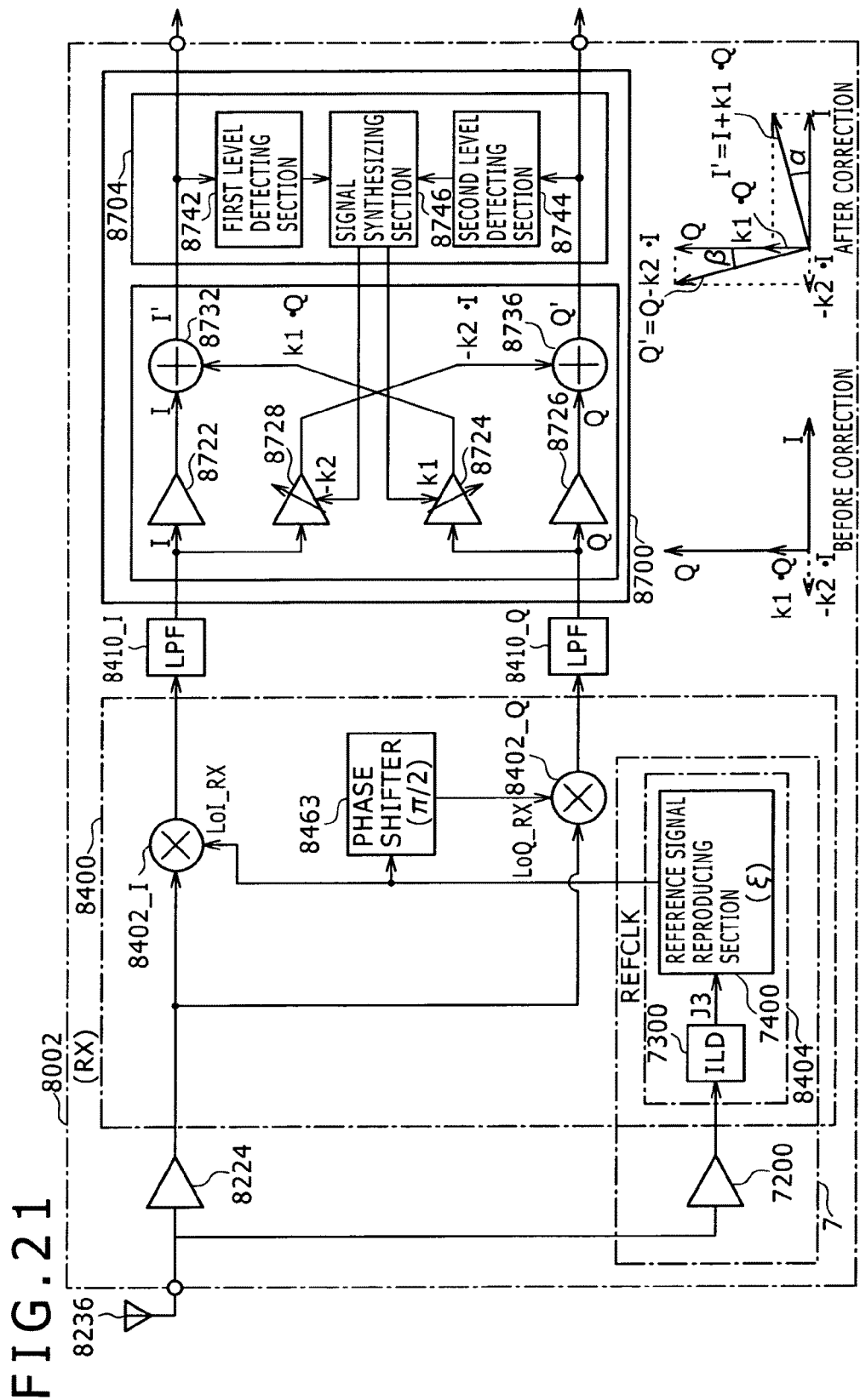
FIG. 21 is a diagram of assistance in explaining an example of configuration of a phase correcting section.

FIG. 20 and FIG. 21 are diagrams of assistance in explaining phase uncertainty and measures against the phase uncertainty. In the following, the reference signal Jx will be represented as a reference signal REFCLK_TX.

In the present embodiment, a reference signal receiving device 7 reproduces a reference signal REFCLK by frequency-dividing a multiplied reference signal J1 into 1/$\xi$. Thus, even when the frequency of the reference signal REFCLK supplied to each position (each communicating device 2 in the present example) is the same (frequency synchronization is achieved) and the phase of the reference signal REFCLK is locked (phase synchronization is achieved), a phenomenon in which the phase of the reference signal REFCLK supplied to each position is not identical (which phenomenon will be referred to as phase uncertainty) can occur. No problem is presented even when there is phase uncertainty in a system in which functional parts using the reference signal REFCLK need only to achieve frequency synchronization and phase synchronization. On the other hand, phase uncertainty can be a problem in the radio transmission system 1 described in the foregoing embodiment because the receiving side (demodulating functional part 8400) performs demodulation using synchronous detection. This point will be described in the following.

[Phase Uncertainty]

FIG. 20 shows a relation between a multiplied reference signal J1 as an example of a high-frequency reference signal and the reference signal REFCLK supplied to each communicating device 2 and a relation of phase uncertainty. The relations are shown in FIG. 20 supposing that a reference signal reproducing section 7400 performs frequency-dividing operation in synchronism with the rising edge of the multiplied reference signal J1.

In the present embodiment, the reference signal receiving device 7 provided so as to correspond to each communicating device 2 reproduces a reference signal REFCLK to be used by the corresponding communicating device 2 by frequency-dividing the multiplied reference signal J1 into 1/$\xi$ times the frequency of the multiplied reference signal J1. That is, the reference signal receiving device 7 generates the reference signal REFCLK of a low frequency 1/$\xi$ times the frequency of the multiplied reference signal J1 from the high-frequency multiplied reference signal J1 frequency-synchronized and phase-synchronized with the reference signal REFCLK_TX. Thus, there are $\xi$ kinds of phase obtaining methods. There is no information on which of the methods to choose. The problem of phase uncertainty therefore occurs in the reference signal REFCLK for each communicating device 2.

For simplicity, in FIG. 20, a multiplication number $\xi$_TX on the transmitting side for the reference signal REFCLK_TX and a multiplication number $\xi$_RX on the receiving side are set at "2." Because the reference signal reproducing section 7400 generates the reference signal REFCLK of ½ times the frequency of a multiplied reference signal J3, there are two kinds of phase obtaining methods, and there is no information on which of the two methods to choose. Thus, one of a reference signal REFCLK_1 (phase difference Δ of zero degrees) and a reference signal REFCLK_2 (phase difference Δ of 180 degrees) is generated on the receiving side for the reference signal REFCLK_TX on the transmitting side. Therefore the problem of phase uncertainty occurs.

In a case where a modulation system is a uniaxial modulation system such as ASK, BPSK or the like, the phases of carrier signals respectively used on the transmitting side and the receiving side need to coincide with each other. Thus, depending on a setting of a multiplication number $\epsilon$, effect can be produced when a demodulating functional part 8400 performs demodulation processing by synchronous detection.

In a case where a modulation system is a biaxial modulation system such as QPSK, QAM or the like, the phases of carrier signals respectively used on the I-axis and the Q-axis of the transmitting side and the receiving side need to coincide with each other. Thus, not only the uncertainty of the phases of the carrier signals used on the receiving side but also the uncertainty of the phases of the carrier signals used on the transmitting side can be a problem.

In order to eliminate the effect of phase uncertainty, a phase uncertainty countermeasure functional part is desirably provided which suppresses effect attendant on the non-coincidence of the phase of one second high-frequency reference signal used for first signal processing with the phase of another second high-frequency reference signal used for second signal processing corresponding to the first signal processing. As for the phase uncertainty countermeasure functional part, transmitting information on which phase to choose and selecting an appropriate phase on the basis of the information, setting the set value of the multiplication number $\epsilon$ to a value that prevents phase uncertainty from becoming a problem, or providing a phase correcting section, for example, is considered.

Phase uncertainty typically becomes a problem in the communication system using synchronous detection described in the foregoing embodiment, and the phase uncertainty countermeasure functional part is desirably provided as a measure against the phase uncertainty. However, the application of the phase uncertainty countermeasure functional part is not limited to this. In any case, the phase uncertainty countermeasure functional part described above can be applied when it is necessary to eliminate effect attendant on the non-coincidence of the phase of one second high-frequency reference signal used for first signal processing with the phase of another second high-frequency reference signal used for second signal processing corresponding to the first signal processing.

[Countermeasure Circuit against Phase Uncertainty]

For the configuration of the phase correcting section as an example of the phase uncertainty countermeasure functional part, a first method is considered in which a level detecting section is provided in a stage subsequent to a demodulation output (for example a filter processing section 8410), and in which a receiving side local oscillating section 8404 (specifically a reference signal receiving device 7 forming the receiving side local oscillating section 8404: the same is true in the following) is controlled on the basis of a demodulation output level detected by the level detecting section to change the phase of an output signal of the receiving side local oscillating section 8404 (carrier signal to a frequency mixing circuit 8402). The first method is a system of directly controlling the phase itself of the demodulation carrier signal. In the case of a biaxial modulation system using an I-axis and a Q-axis such as a QPSK system or the like, it suffices to apply the first method to components of the respective axes.

In addition, even in the case of a uniaxial modulation system such as an ASK system, a BPSK system or the like, a second method is considered in which a quadrature detection system is applied to the demodulating functional part 8400, and in which a phase rotating section and a level detecting section are provided in a stage subsequent to the demodulating functional part 8400, so that the phase of an output signal is rotated in the phase rotating section using a quadrature detection output (I and Q), and the phase rotating section is controlled on the basis of the output level of the phase rotating section to change an amount of rotation. In the case of a uniaxial modulation system such as the ASK system, the BPSK system or the like, it suffices to apply level detection and phase rotation to only an I-axis component. On the other hand, in the case of a biaxial modulation system such as a QPSK system or the like, phase correction is made by changing and synthesizing the levels of an I-signal and a Q-signal. The second method is easily made to be digital processing, and the phase correction may be applied in a digital circuit after AD conversion of the I-signal and the Q-signal.

The first method has a simpler circuit configuration. However, in the first method, correction control is difficult because a high-frequency circuit makes phase change. On the other hand, in the second method, correction control is easy because a baseband circuit makes phase change. In the following, concrete description will be made of the second method adopted in the case of the QPSK system.

FIG. 21 is a diagram of assistance in explaining a phase correcting section 8700 provided as a measure against phase uncertainty. A receiving chip 8002 employs a quadrature detection system for a demodulating functional part 8400 (see FIG. 5), and has the phase correcting section 8700 in a stage subsequent to a quadrature detection circuit.

The phase correcting section 8700 has a phase rotating section 8702 for performing phase rotation processing using the outputs (I and Q) of filter processing sections 8410_I and 8410_Q for quadrature detection and a level detecting section 8704 for detecting the amplitude levels of output signals of the phase rotating section 8702.

The phase rotating section 8702 has a first gain adjusting section 8722 for making gain adjustment for the signal I of an I-axis component, a second gain adjusting section 8724 for making gain adjustment for the signal Q of a Q-axis component, and a signal synthesizing section 8732 for synthesizing output signals of the respective gain adjusting sections 8722 and 8724. An output signal I' of the signal synthesizing section 8732 is a final demodulated signal of the I-axis component. The gain adjustment adjusts an amount of phase rotation α for the I-axis component. Normally, it suffices to adjust the amount of phase rotation α by only the gain adjustment (gain=k1) on the side of the second gain adjusting section 8724 while the gain of the first gain adjusting section 8722 is fixed (gain=1). For example, as shown in FIG. 21, the signal synthesizing section 8732 generates the output signal I' by adding together the signal I output from the first gain adjusting section 8722 and a signal "k1·Q" output from the second gain adjusting section 8724.

In addition, the phase rotating section 8702 has a third gain adjusting section 8726 for making gain adjustment for the signal Q of the Q-axis component, a fourth gain adjusting section 8728 for making gain adjustment for the signal I of the I-axis component, and a signal synthesizing section 8736 for synthesizing output signals of the respective gain adjusting sections 8726 and 8728. An output signal Q' of the signal synthesizing section 8736 is a final demodulated signal of the Q-axis component. The gain adjustment adjusts an amount of phase rotation β for the Q-axis component. Normally, it suffices to adjust the amount of phase rotation β by only the gain adjustment (gain=k2: −k2 in consideration of the phase) on the side of the fourth gain adjusting section 8728 while the gain of the third gain adjusting section 8726 is fixed (gain=1). For example, as shown in FIG. 21, the signal synthesizing section 8736 generates the output signal Q' by subtracting a signal "−k2·I" output from the fourth gain adjusting section 8728 from the signal Q output from the third gain adjusting section 8726.

Any of a first configuration example in which input to the level detecting section 8704 is only the output signal I' of the signal synthesizing section 8732 for the I-axis component, a second configuration example in which input to the level detecting section 8704 is only the output signal Q' of the signal synthesizing section 8736 for the Q-axis component, and a third configuration example in which input to the level detecting section 8704 is both the output signal I' of the signal synthesizing section 8732 for the I-axis component and the output signal Q' of the signal synthesizing section 8736 for the Q-axis component may be used. When both of I and Q are used, a circuit scale is larger than in the cases of using only one of I and Q, but adjustment accuracy is improved.

FIG. 21 shows the third configuration example using both of I and Q. The level detecting section 8704 has a first level detecting section 8742 for detecting the level of the output signal I' of the signal synthesizing section 8732, a second level detecting section 8744 for detecting the level of the output signal Q' of the signal synthesizing section 8736, and a signal synthesizing section 8746 for generating a rotation control signal ROT by synthesizing respective output signals of the first level detecting section 8742 and the second level detecting section 8744. The signal synthesizing section 8746 generates the rotation control signal ROT by subtracting a level signal DET_Q output from the second level detecting section 8744 from a level signal DET_I output from the first level detecting section 8742.

In any case, a known pattern is desirably transmitted for adjustment. For example, in the cases of only one of I and Q (the first configuration example and the second configuration example), the known pattern is desirably the signal of only the corresponding component, and in the case of both of I and Q (the third configuration example), the known pattern is desirably the signal of only one of the components (the signal of only the I-component or the signal of only the Q-component).

For example, in the case of the configuration shown in FIG. 21 in which the level detecting section 8704 uses both of I and Q, at a time of gain adjustment for phase correction, a BPSK signal is input to the demodulating functional part 8400, the phase of an output signal from the demodulating functional part 8400 is rotated in the phase rotating section 8702 using the quadrature detection output (I and Q), and the output (the I' component and the Q' component) of the phase rotating section 8702 is detected in the level detecting section 8704. The level detecting section 8704 controls the phase rotating section 8702 on the basis of the detected amplitude level to change an amount of rotation. For example, the level detecting section 8704 adjusts the gains of the second gain adjusting section 8724 and the fourth gain adjusting section 8728 in the phase rotating section 8702 so as to minimize a level difference between the I' component and the Q' component.

Though not shown, a method of control of the level detecting section 8704 in the case of adopting the first method which controls the receiving side local oscillating section 8404 to change the phase of a reproduced carrier signal Lo_RX (carrier signal to the frequency mixing circuit 8402) as output of the receiving side local oscillating section 8404 is desirably as follows. First, any of a first configuration example in which input to the level detecting section 8704 is only the output signal I of the filter processing section 8410_I for the I-axis component, a second configuration example in which input to the level detecting section 8704 is only the output signal Q of the filter processing section 8410_Q for the Q-axis component, and a third configuration example in which input to the level detecting section 8704 is both the output signal I of the filter processing section 8410_I for the I-axis component and the output signal Q of the filter processing section 8410_Q for the Q-axis component may be used. When both of I and Q are used, a circuit scale is larger than in the cases of using only one of I and Q, but adjustment accuracy is improved.

In the cases of the first configuration example and the second configuration example using only one of I and Q, the phase correcting section 8700 controls the receiving side local oscillating section 8404 (formed by a PLL shown in FIG. 4, for example) so as to maximize the amplitude level detected in the level detecting section 8704 for the component transmitted as a known pattern for adjustment.

In the case of the third configuration example using both of I and Q, while making the amplitude level detected in the level detecting section 8704 for one component (for example the I-component) transmitted as a known pattern as high as possible, and making the amplitude level detected in the level detecting section 8704 for the other component (for example the Q-component) not transmitted as the known pattern as low as possible, the phase correcting section 8700 desirably strikes a balance between the two components. Alternatively, with attention directed to only one component (for example the I-component) transmitted as a known pattern, the phase correcting section 8700 may make adjustment so as to maximize the amplitude level detected in the level detecting section 8704, or with attention directed to only the other component (for example the Q-component) not transmitted as the known pattern, the phase correcting section 8700 may make adjustment so as to minimize the amplitude level detected in the level detecting section 8704.

While the present disclosure has been described above using embodiments thereof, the technical scope of the present disclosure is not limited to the scope described in the foregoing embodiments. Various changes or improvements can be added to the foregoing embodiments without departing from the spirit of the disclosure, and forms obtained by adding such changes or improvements are also included in the technical scope of the present disclosure.

In addition, the foregoing embodiments do not limit disclosures of claims, and not all combinations of features described in the embodiments are necessarily essential to solving means of the disclosure. The foregoing embodiments include disclosures in various stages, and various disclosures can be extracted by appropriately combining a plurality of disclosed constitutional requirements. Even when a few constitutional requirements are omitted from all the constitutional requirements disclosed in the embodiments, constitutions resulting from the omission of the few constitutional requirements can be extracted as disclosures as long as an effect is obtained.

For example, in the foregoing embodiments, modulation processing and demodulation processing in communication processing have been shown as an example of signal processing using the reference signal Jx and the reference signal REFCLK. However, the reference signal Jx and the reference signal REFCLK can be used for applications other than communications. For example, the mechanism according to the present embodiment can be applied as a clock for a digital circuit or a reference for a synthesizer.

In the foregoing embodiments, an example has been shown in which the multiplied reference signal J1 is transmitted by radio in the millimeter wave band. However, the frequency of the multiplied reference signal J1 may be set in a frequency band lower than the millimeter wave band, and then the multiplied reference signal J1 may be transmitted by wire. The multiplied reference signal J1 is set in a "frequency band lower than the millimeter wave band" in order to avoid the problems of signal distortion and spurious radiation.

In the foregoing embodiments, an example has been shown in which the communicating device 2 on the receiving side performs demodulation processing by synchronous detection. However, in the case of the ASK system (amplitude modulation system), demodulation processing may be performed by envelope detection or square-law detection. In this case, there is an advantage in that phase uncertainty does not become a problem.

In the foregoing embodiments, an example has been shown in which the reference signal transmission system 3 is applied to intra-device (casing) or inter-device signal transmission (data transmission) in the millimeter wave band between communicating devices 2. However, communication between communicating devices 2 is not limited to communication in the millimeter wave band, but may use a transmission band of lower frequencies. In addition, the reference signal transmission system 3 is not limited to application to intra-casing transmission and inter-device transmission, but is applicable, to fields of ordinary communications.

The present application contains subject matter related to that disclosed in Japanese Priority Patent Application JP 2010-130275 filed in the Japan Patent Office on Jun. 7, 2010, the entire content of which is hereby incorporated by reference.

What is claimed is:

1. A signal transmission system comprising:
a first signal processing section configured to perform signal processing on a basis of a reference signal;
a high-frequency reference signal generating section configured to generate and transmit a high-frequency reference signal having a higher frequency than said reference signal such that the high-frequency reference signal is synchronized with said reference signal;
a low-frequency reference signal generating section configured to receive said high-frequency reference signal from said high-frequency reference signal generating section, and generate a low-frequency reference signal having a lower frequency than said high-frequency reference signal such that the low-frequency reference signal is synchronized with the received high-frequency reference signal; and
a second signal processing section configured to perform signal processing on a basis of said low-frequency reference signal generated by said low-frequency reference signal generating section,
wherein a processed signal processed by the first signal processing section is output together with said high-frequency reference signal, and
said second signal processing section performs the signal processing on the processed signal processed by said first signal processing section.

2. The signal transmission system according to claim 1, further comprising:
a functional part for transmitting said high-frequency reference signal by radio.

3. A signal transmission comprising:
a fiat signal processing section configured to perform processing on basis of a reference signal;
a high-frequency reference signal generating section configured to generate and transmit a high-frequency reference signal having a higher frequency than said reference signal such that the high-frequency reference signal is synchronized with said reference signal:
a low-frequency reference signal generating section configured to receive said high-frequency reference signal from said high-frequency reference signal generating section, and generate a low-frequency reference signal having a lower frequency than said high-frequency reference signal such that the low-frequency reference signal is synchronized with the received high-frenquency reference signal;
a second signal processing section configured to perform signal processing on a basis of said low-frequency reference signal generated by said low-frequency reference signal generating section; and
a functional part for transmitting said high-frequency reference signal by radio,
wherein said first signal processing section performs modulation processing on a basis of said reference signal, and
said second signal processing section performs demodulation processing on a modulated signal processed by said first signal processing section on a basis of said high-frequency reference signal generated by said high-frequency reference signal generating section.

4. The signal transmission system according to claim 1, further comprising:
a phase uncertainty countermeasure functional part for suppressing an effect attendant on non-coincidence of a phase of said reference signal used by said first signal processing section with a phase of said low-frequency reference signal used by said second signal processing section.

5. The signal transmission system according to claim 1, wherein said first signal processing section, said high-frequency reference signal generating section, said low-frequency reference signal generating section, and said second signal processing section are housed within a casing of an identical electronic device, and a radio signal transmission line for allowing transmission by radio between said high-frequency reference signal generating section and said low-frequency reference signal generating section is formed within said casing.

6. The signal transmission system according to claim 1, wherein said first signal processing section and said high-frequency reference signal generating section are housed within a casing of a first electronic device, said low-frequency reference signal generating section and said second signal processing section are housed within a casing of a second electronic device, and a radio signal transmission line for allowing transmission by radio is formed between said high-frequency reference signal generating section within said first electronic device and said low-frequency reference signal generating section within said second electronic device when said first electronic device and said second electronic device are disposed in a determined position.

7. A signal processing device comprising:
a first signal processing section configured to perform signal processing on a basis of a reference signal;
a high-frequency reference signal generating section configured to generate and transmit a high-frequency reference signal having a higher frequency than said reference signal such that the high-frequency reference signal is synchronized with said reference signal;

a low-frequency reference signal generating section configured to receive said high-frequency reference signal from said high-frequency reference signal generating section, and generate a low-frequency reference signal having a lower frequency than said high-frequency reference signal such that the low-frequency reference signal is synchronized with the received high-frequency reference signal; and a second signal processing section configured to perform signal processing on a basis of said low-frequency reference signal generated by said low-frequency reference signal generating section, wherein a processed signal processed by the first signal processing section is output together with said high-frequency reference signal, and said second processing section performs the signal processing on the processed signal processed by said first signal processing section.

8. An electronic device comprising:

a first signal processing section configured to perform signal processing on a basis of a reference signal;

a high-frequency reference signal generating section configured to generate and transmit a high-frequency reference signal having a higher frequency than said reference signal such that the high-frequency reference signal is synchronized with said reference signal;

a low-frequency reference signal generating section configured to receive said high-frequency reference signal from said high-frequency reference signal generating section, and generate a low-frequency reference signal having a lower frequency than said high-frequency reference signal such that the low-frequency reference signal is synchronized with the received high-frequency reference signal; and a second signal processing section configured to perform signal processing on a basis of said low-frequency reference signal generated by said low-frequency reference signal generating section, wherein a processed signal processed by the first signal processing section is output together with said high-frequency reference signal, and said second signal processing section perform the signal processing on the processed signal processed by said first signal processing section.

9. A signal transmission method comprising:

performing, by a first signal processing section, a first signal processing on a basis of a reference signal to produce a first signal;

generating and transmitting a high-frequency reference signal having a higher frequency than said reference signal such that the high-frequency reference signal is synchronized with said reference signal;

receiving said high-frequency reference signal from said high-frequency reference signal generating section, and generating a low-frequency reference signal having a lower frequency than said high-frequency reference signal such that the low-frequency reference signal is synchronized with the received high-frequency reference signal;

outputting the first signal together with said high-frequency reference signal; and performing, by a second signal processing section, a second signal processing on a basis of said low-frequency reference signal, the second signal processing being performed on the first signal.

* * * * *